(12) United States Patent
Hirabayashi

(10) Patent No.: US 7,407,735 B2
(45) Date of Patent: *Aug. 5, 2008

(54) LIGHT SENSITIVE PLANOGRAPHIC PRINTING PLATE PRECURSOR AND ITS PROCESSING METHOD

(75) Inventor: Kazuhiko Hirabayashi, Kanagawa (JP)

(73) Assignee: Konica Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/334,334

(22) Filed: Jan. 18, 2006

(65) Prior Publication Data

US 2006/0134550 A1 Jun. 22, 2006

Related U.S. Application Data

(62) Division of application No. 10/443,943, filed on May 22, 2003, now Pat. No. 7,074,546.

(30) Foreign Application Priority Data

Jun. 24, 2002 (JP) ............... 2002-182681
Jun. 26, 2002 (JP) ............... 2002-185985

(51) Int. Cl.
*G03C 1/77* (2006.01)
*G03F 7/028* (2006.01)
*G03F 7/031* (2006.01)
*G03F 7/09* (2006.01)
*G03F 7/11* (2006.01)

(52) U.S. Cl. ............... 430/271.1; 430/273.1; 430/278.1; 430/926; 430/281.1; 430/285.1; 430/302

(58) Field of Classification Search ............... None
See application file for complete search history.

(56) References Cited

U.S. PATENT DOCUMENTS

| 3,717,558 | A | 2/1973 | McGiniss |
| 4,983,498 | A | 1/1991 | Rode et al. |
| 5,011,760 | A | 4/1991 | Yamaguchi et al. |
| 5,049,479 | A | 9/1991 | Zertani et al. |
| 5,055,372 | A | 10/1991 | Shanklin et al. |
| 5,229,253 | A | 7/1993 | Zertani et al. |
| 5,273,862 | A | 12/1993 | Zertani et al. |
| 6,335,144 | B1 * | 1/2002 | Murota et al. ............ 430/281.1 |
| 2003/0118945 | A1 | 6/2003 | Okamoto |
| 2003/0186165 | A1 | 10/2003 | Gries et al. |
| 2003/0194649 | A1 * | 10/2003 | Matsumura ............... 430/281.1 |
| 2003/0215744 | A1 | 11/2003 | Gries |
| 2004/0091816 | A1 | 5/2004 | Matsumura et al. |
| 2004/0219459 | A1 | 11/2004 | Hirabayash |

FOREIGN PATENT DOCUMENTS

| EP | 0 447 930 A2 | 9/1991 |
| EP | 0 453 953 A2 | 10/1991 |
| EP | 0 821 276 A1 | 1/1998 |
| EP | 0 287 818 A2 | 10/1998 |
| EP | 1 079 276 A1 | 2/2001 |
| JP | 10-062978 A | 3/1998 |

* cited by examiner

*Primary Examiner*—Sin J. Lee
(74) *Attorney, Agent, or Firm*—Frishauf, Holtz, Goodman & Chick, P.C.

(57) ABSTRACT

Disclosed are a light sensitive planographic printing plate precursor and its processing method, the precursor comprising a hydrophilic support and provided thereon, a photopolymerizable light sensitive layer containing a compound represented by the following formula (1) or (2) and a compound represented by the following formula (3) or (4):

formula (1)

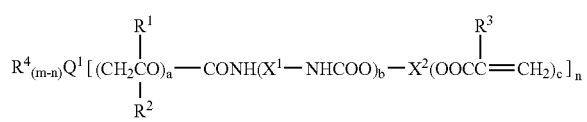

formula (2)

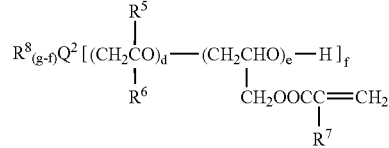

formula (3)

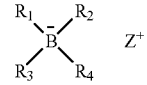

formula (4)

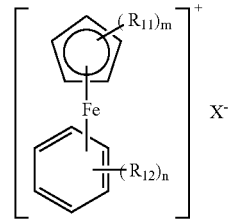

4 Claims, No Drawings

LIGHT SENSITIVE PLANOGRAPHIC PRINTING PLATE PRECURSOR AND ITS PROCESSING METHOD

This application is a divisional application of application Ser. No. 10/443,943, filed May 22, 2003 now U.S. Pat. No. 7,074,546, which is hereby incorporated in its entirety herein by this reference.

FIELD OF THE INVENTION

The present invention relates to a light sensitive planographic printing plate precursor and a processing method thereof, and particular to a light sensitive planographic printing plate precursor providing excellent sensitivity, excellent printing durability, excellent stain elimination property, excellent dot reproduction, and excellent sludge restraining property, and a processing method thereof.

BACKGROUND OF THE INVENTION

A light sensitive planographic printing plate precursor (hereinafter referred to also as a printing plate precursor) is known which comprises a support subjected to hydrophilization treatment and provided thereon, a photopolymerizable layer and a protective layer. Recently, in order to obtain a printing plate with high resolution image in a short time or to carry out a direct plate making system, a method has been applied in which a planographic printing plate precursor is digitally exposed based on image information employing laser rays, and developed with a developer to prepare a printing plate.

As one embodiment, there is a system preparing a planographic printing plate in which a light sensitive planographic printing plate precursor is scanning-exposed employing a light source modulated with an image signal transmitted by communication lines or output signals from an electronic plate making system or an image processing system.

Generally, a photopolymerizable layer contains an acryl monomer, an alkali soluble resin, a photo-initiator, and optionally a sensitizing dye to absorb a range of wavelengths of emitted light (particularly laser light).

As a light source for exposing a photopolymerization type light sensitive planographic printing plate precursor is used a visible light source having a longer wavelength such as an Ar laser (488 nm) or an FD-YAG laser (532 nm). In recent years, semiconductor lasers employing, for example, InGaN type material, which can continuously emit light with a wavelength of from 380 to 430 nm, are about to be put into practical use. A scanning exposure system employing light with such a short wavelength as a light source has advantages in providing sufficient output power and an economical system, since the semiconductor lasers can be structurally manufactured at low cost. Further, a light sensitive planographic printing plate precursor to be applied to the above light source has a spectral sensitivity shorter than that of a planographic printing plate precursor to be applied to a system employing a conventional FD-YAG laser or Ar laser, and therefore provides an excellent safe light property, whereby operation under room light is easy.

Herein, sensitivity of the light sensitive planographic printing plate precursor to short wavelength light is problem. Many proposals have been made regarding photopolymerizable light sensitive materials sensitive to a visible light with a wavelength exceeding 450 nm. For example, there are a combination of specific sensitive dyes disclosed I U.S. Pat. No. 2,850,445 and amines (JP 44-20189), a combination of hexaarylbiimidazoles and dyes (JP 45-37377), a combination of hexaarylbiimidazoles and p-dialkylaminobenzylideneketones (JP 45-2528 and Japanese Patent O.P.I. Publication No. 54-155292), a combination of cyclic-cis-α-dicarbonyl compounds and dyes (Japanese Patent O.P.I. Publication No. 48-84183), a combination of cyclictriazine compounds and merocyanine dyes (Japanese Patent O.P.I. Publication No. 54-151024), a combination of keto-cumarine and active agents (Japanese Patent O.P.I. Publication Nos. 52-112681 and 58-15503), a combination of bisimidazole, styrene derivatives and thiols (Japanese Patent O.P.I. Publication No. 59-140203), a combination of organic peroxides and dyes (Japanese Patent O.P.I. Publication Nos. 59-140203 and 59-189340), a combination of dyes with a rhodanine nucleus and radical generating agents (Japanese Patent O.P.I. Publication No. 2-244050), and a combination of aliphatic amine salts and pyrromethene borate dyes (Japanese Patent O.P.I. Publication No. 2000-250206).

It is disclosed in Japanese Patent O.P.I. Publication Nos. 59-152396, 61-151197, 63-10602, 63-41484, and 3-12403 that titanocenes are effective as a photopolymerization initiator. A combination of titanocenes and 3-ketocumarine dyes is disclosed in Japanese Patent O.P.I. Publication No. 63-221110, a combination of titanocenes, xanthene dyes and monomers having an amino group or a urethane group in Japanese Patent O.P.I. Publication Nos. 4-221958 and 4-219756, and a combination of titanocenes, and specific merocyanine dyes in Japanese Patent O.P.I. Publication Nos. 6-295061 and 9-328505.

However, these methods are not satisfactory in sensitivity.

A photopolymerization type light sensitive planographic printing plate precursor is imagewise exposed, optionally heated, washed with water (in order to remove a protective layer), developed with a developer to remove unexposed portions, washed with water, and post-processed with a finisher or a gumming solution to make non-image portions hydrophilic. Thus, a printing plate is obtained. When the protective layer at image portions is not sufficiently removed or finisher or gum components are firmly fixed to the image portions, ink receptivity of the image portions is insufficient, resulting in loss of printed paper sheets. As the countermeasure, a method is proposed in Japanese Patent O.P.I. Publication No. 10-315598, which controls a residual solvent content of the light sensitive layer before the protective layer is provided. However, this method is not satisfactory.

An aqueous alkaline solution having a pH of not less than 12.5 is generally used in order to remove the light sensitive layer at non-image portions, i.e., develop the light sensitive layer. In recent years, development employing an alkali developer having a lower pH has been required in view of workability, safety, or environmental concerns.

However, development of the conventional photopolymerizable light sensitive planographic printing plate precursor with a lower pH alkali developer has a problem in that developability is lowered, and sludge is likely to occur in the developer. Improvement of developability employing a low pH alkali developer is likely to result in lowering of ink receptivity and printing durability.

Further, when the conventional photopolymerizable light sensitive planographic printing plate precursor is exposed to laser, and developed with a developer while replenished with a developer replenisher for along time without being exchanged to fresh developer, sludge occurs in the developer, and the resulting planographic printing plate has problems in that spotted stain or slight contamination occurs at non-image portions, and ink contamination at dot image portions during printing. A developer, after a large number of light sensitive planographic printing plate precursor was processed, lowers dot image reproduction, particularly reproduction of small dots, dots at shadows, and thin lines, wherein prints with stable quality cannot be obtained. Particularly when printing is carried out employing ink containing no petroleum volatile solvent for environmental reason, such lowering is likely to occur.

SUMMARY OF THE INVENTION

The present invention has been made in view of the above. An object of the invention is to provide a light sensitive planographic printing plate precursor, which is excellent in sensitivity, printing durability, stain elimination property, dot reproduction, and sludge restraining property. Another object of the invention is to provide a light sensitive planographic printing plate precursor, which is excellent in a safe light property.

DETAILED DESCRIPTION OF THE INVENTION

The above objects of the invention can be attained by the followings:

1-1. A light sensitive planographic printing plate precursor comprising a hydrophilic support and provided thereon, a photopolymerizable light sensitive layer containing a first compound represented by the following formula (1) or (2) and a second compound represented by the following formula (3) or (4);

formula (1)

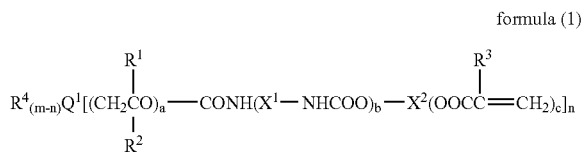

wherein $Q^1$ represents

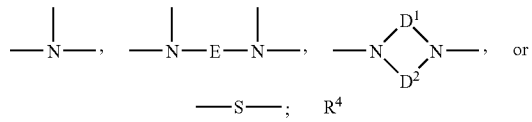

represents an alkyl group, a hydroxy alkyl group, or an aryl group; $R^1$ and $R^2$ independently represent a hydrogen atom, an alkyl group, or an alkoxyalkyl group; $R^3$ represents a hydrogen atom, a methyl group, or an ethyl group; $X^1$ represents a divalent linkage group having a carbon atom number of from 2 to 12; $X^2$ represents a divalent linkage group, a trivalent linkage group, a tetravalent linkage group, or

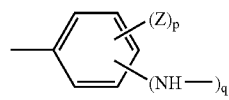

in which Z represents a hydrogen atom, an alkyl group, an alkenyl group, an aryl group, a halogen atom, an alkoxy group, or a heterocyclic group, p is an integer of from 1 to 4, and q is an integer of from 1 to 3; $D^1$ and $D^2$ independently reptesent a divalent linkage group having a carbon atom number of from 1 to 5; E represents an alkylene group having a carbon atom number of from 2 to 12 or an arylene group having a carbon atom number of from 6 to 12; a is an integer of from 1 to 4; b is 0 or 1; c is an integer of from 1 to 3; m is an integer of from 2 to 4; and n is an integer of from 1 to m, provided that plural groups having the same definition may be the same or different, formula (2)

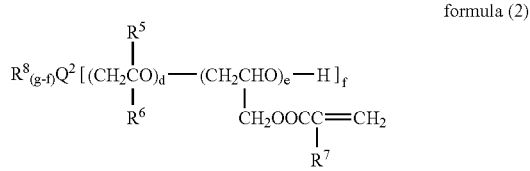

wherein $Q^2$ represents

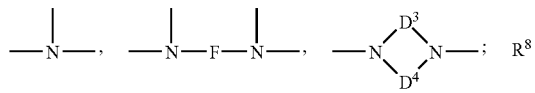

$R_8$ represents an alkyl group, a hydroxyalkyl group, or an aryl group; $R^5$ and $R^6$ independently represent a hydrogen atom, an alkyl group, or an alkoxyalkyl group; and $R^7$ represents a hydrogen atom, a methyl group, or an ethyl group; $D^3$ and $D^4$ independently represent a divalent saturated hydrocarbon group having a carbon atom number of from 1 to 5; F represents an alkylene group having a carbon atom number of from 2 to 12 or an arylene group having a carbon atom number of from 6 to 12; d and e independently represent an integer of from 1 to 4; g is an integer of from 2 to 4; and f is an integer of from 1 to g, provided that plural groups having the same definition may be the same or different, formula (3)

wherein $R_1$, $R_2$, and $R_3$ independently represent an alkyl group, an aryl group, an aralkyl group, an alkenyl group, a silyl group, a heterocyclic group or a halogen atom; and $Z'$ is a cationic group, formula (4)

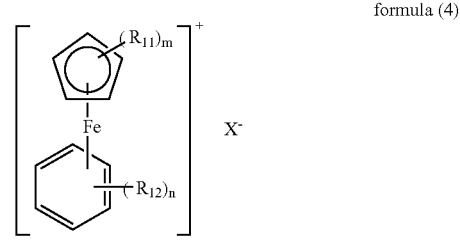

wherein $R_{11}$ and $R_{12}$ may be the same or different, and independently represent an alkyl group having a carbon atom number of from 1 to 12, an alkinyl group having a carbon atom number of from 2 to 12, an alkoxy group having a carbon atom number of from 1 to 8, a cyano group, an alkylthio group, a phenoxy group, a monocarboxyl or ester group having a carbon atom number of from 2 to 6, an alkanoyl group having a carbon atom number of from 2 to 5, an ammonium group, a pyridinium group, a nitro group, an alkylsulfinyl group, an alkylsulfonyl group, a sulfamoyl group or a halogen atom, provided that $R_{12}$ may form a condensed ring with the benzene ring; X represents $BF_4$, $PF_6$, $AsF_6$, $FeCl_4$, $SnCl_6$, $SbCl_6$, or $BiCl_6$; m is an integer of from 1 to 4; and n is an integer of from 1 to 5.

1-2. The light sensitive planographic printing plate precursor of item 1-1 above, wherein the second compound is a compound represented by the formula (3).

1-3. The light sensitive planographic printing plate precursor of item 1-1 above, wherein the second compound is a compound represented by the formula (4).

1-4. The light sensitive planographic printing plate precursor of item 1-1 above, further comprising a sensitizing dye having an absorption maximum in the wavelength regions of from 350 to 450 nm.

1-5. The light sensitive planographic printing plate precursor of item 1-1 above, wherein the sensitizing dye is selected from the group consisting of compounds represented by the following formula (5), (6), (7), and (8),

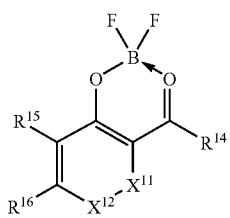

formula (5)

wherein $R^{14}$ represents a hydrogen atom, an alkyl group which may have a substituent, an alkenyl group which may have a substituent, an aryl group or a heterocyclic group; $R^{15}$ and $R^{16}$ represent a substituent capable of combining with each other to form a ring; and $X^{11}$ and $X^{12}$ independently represent —$CR^{17}R^{18}$—, —O—, —S—, or —$NR^{19}$—, in which $R^{17}$, $R^{18}$, and $R^{19}$ independently represent a hydrogen atom, an alkyl group, an alkenyl group, an aryl group or a heterocyclic group,

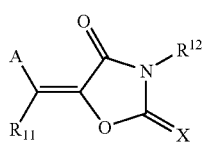

formula (6)

wherein A represents an aryl group or a heterocyclic group; X represents an oxygen atom, a sulfur atom or —$N(R_{13})$—; and $R_{11}$, $R_{12}$, and $R_{13}$ independently represent a hydrogen atom or a substituent, provided that A and $R_{11}$ may combine with each other to form a condensed ring or $R_{12}$ and $R_{13}$ may combine with each other to form a ring,

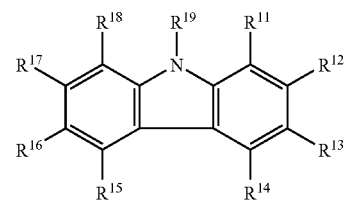

Formula (7)

wherein $R^{11}$, $R^{12}$, $R^{13}$, $R^{14}$, $R^{15}$, $R^{16}$, $R^{17}$, $R^{18}$ and $R^{19}$ independently represent a hydrogen atom or a substituent, provided that two adjacent groups of $R^{11}$, $R^{12}$, $R^{13}$, $R^{14}$, $R^{15}$, $R^{16}$, $R^{17}$, $R^{18}$ and $R^{19}$ may combine with each other to form a ring, and at least one of $R^{11}$ and $R^{13}$ represents an organic residue represented by the following formula P,

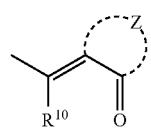

formula P in which $R^{10}$ represents a hydrogen atom or a substituent; and Z represents a non-metallic atomic group necessary to form a 5-member acidic nucleus, and wherein when $R^{11}$ is represented by formula P, $R^{10}$ may combine with $R^{12}$ or $R^{19}$ to form a ring, when $R^{13}$ is represented by formula P, $R^{10}$ may combine with $R^{12}$ or $R^{14}$ to form a ring, and when $R^{11}$ and $R^{13}$ both are represented by formula P, $R^{10}$ may combine with $R^{14}$ or $R^{19}$ to form a ring,

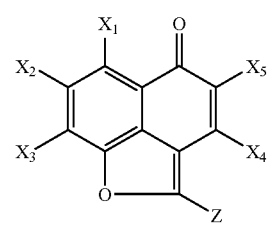

formula (8)

wherein $X_1$, $X_2$, $X_3$, $X_4$ and $X_5$ independently represent a substituent; and Z represents an aryl group or an aromatic heterocyclic group.

1-6. The light sensitive planographic printing plate precursor of item 1-1 above, further comprising a color layer provided on the photopolymerizable light sensitive layer, the color layer having an optical density at wavelength regions of from 410 to 800 nm of from 0.2 to 3.0.

1-7. The light sensitive planographic printing plate precursor of item 1-1 above, further comprising an overcoat layer containing polyvinyl alcohol provided on the photopolymerizable light sensitive layer.

1-8. The light sensitive planographic printing plate precursor of item 1-1 above, further comprising, provided on the photopolymerizable, an overcoat layer containing polyvinyl alcohol and a color layer having an optical density at wavelength regions of from 410 to 800 nm of from 0.2 to 3.0, wherein the overcoat layer is provided between the photopolymerizable light sensitive layer and the color layer.

1-9. A light sensitive planographic printing plate precursor comprising a hydrophilic support and provided thereon, a photopolymerizable light sensitive layer containing a first compound represented by formula (1) or (2) above and a sensitizing dye having an absorption maximum in the wavelength regions of from 350 to 450 nm, 1-10. The light sensitive planographic printing plate precursor of item 1-9 above, wherein the sensitizing dye is selected from the group consisting of compounds represented by formula (5), (6), (7), and (8) above.

1-11. The light sensitive planographic printing plate precursor of item 1-9 above, further comprising a color layer provided on the photopolymerizable light sensitive layer, the color layer having an optical density at wavelength regions of from 410 to 800 nm of from 0.2 to 3.0.

1-12. The light sensitive planographic printing plate precursor of item 1-9 above, further comprising an overcoat layer containing polyvinyl alcohol provided on the photopolymerizable light sensitive layer.

1-13. The light sensitive planographic printing plate precursor of item 1-9 above, further comprising, provided on the photopolymerizable light sensitive layer, an overcoat layer containing polyvinyl alcohol and a color layer having an optical density at wavelength regions of from 410 to 800 nm of from 0.2 to 3.0, wherein the overcoat layer is provided between the photopolymerizable light sensitive layer and the color layer.

2-1. A light sensitive planographic printing plate precursor comprising a hydrophilic support and provided thereon, a photopolymerizable light sensitive layer containing a first compound represented by formula (1) or (2) above and a second compound represented by formula (3) above.

2-2. A light sensitive planographic printing plate precursor comprising a hydrophilic support and provided thereon, a photopolymerizable light sensitive layer containing a first compound represented by formula (1) or (2) above and a second compound represented by formula (4) above.

2-3. The light sensitive planographic printing plate precursor of item 2-1 or 2-2 above, further comprising a sensitizing dye having an absorption maximum in the wavelength regions of not more than 430 nm.

2-4. A method of processing the light sensitive planographic printing plate precursor of any one of items 2-1 through 2-3 above, the method comprising the step of processing the light sensitive planographic printing plate precursor in the presence of a non-ionic surfactant with a hydrophobic group including an alkyl group in which the molecular weight of the alkyl group is not more than 25% of the total molecular weight of the hydrophobic group.

3-1. A light sensitive planographic printing plate precursor comprising a support and provided thereon, a photopolymerizable light sensitive layer containing a first compound represented by formula (1) above and a sensitizing dye having an absorption maximum in the wavelength regions of from 350 to 450 nm.

3-2. The light sensitive planographic printing plate precursor of item 3-1 above, wherein the sensitizing dye is selected from the group consisting of compounds represented by formulae (5), (6), (7), and (8) above.

3-3. The light sensitive planographic printing plate precursor of item 3-1 or 3-2 above, wherein a color layer having an optical density at wavelength regions of from 410 to 800 nm of from 0.2 to 3.0 is provided on the photopolymerizable light sensitive layer in contact with the photopolymerizable light sensitive layer or through another layer.

3-4. The light sensitive planographic printing plate precursor of any one of items 3-1 through 3-3 above, wherein an overcoat layer containing polyvinyl alcohol is provided on the photopolymerizable light sensitive layer in contact with the photopolymerizable light sensitive layer or through another layer.

3-5. The light sensitive planographic printing plate precursor of any one of items 3-1 through 3-4 above, wherein an overcoat layer containing polyvinyl alcohol is provided on the photopolymerizable light sensitive layer in contact with the photopolymerizable light sensitive layer or through another layer, and a color layer having an optical density at wavelength regions of from 410 to 800 nm of from 0.2 to 3.0 is provided on the overcoat layer in contact with the overcoat layer or through another layer.

The present invention will be explained in detail below. The compound represented by formula (1) in the invention will be detailed below.

In formula (1), examples of the alkyl group represented by $R^4$ include a methyl group, an ethyl group, a propyl group, a butyl group, a pentyl group, an iso-pentyl group, a 2-ethylhexyl group, an octyl group, a decyl group, an n-dodecyl group, an n-tetradecyl group, an n-pentradecyl group, an n-hexadecyl group, an n-heptadecyl group, an n-octadecyl group, and an n-docosadecyl group.

In formula (1), examples of the hydroxyalkyl group represented by $R^4$ include a hydroxymethyl group, a hydroxyethyl group, a hydroxypropyl group, and a hydroxypentyl group.

In formula (1), examples of the aryl group represented by $R^4$ include a phenyl group, and a naphthyl group.

In formula (1), examples of the alkyl group represented by $R^1$ or $R^2$ are the same as those denoted in $R^4$ above.

In formula (1), examples of the alkoxy group represented by $R^1$ or $R^2$ include a methoxymethyl group, a methoxyethyl group, an ethoxymethyl group, and a propoxyethyl group.

In formula (1), the divalent linkage having a carbon atom number of from 2 to 12 represented by $X^1$ is preferably a divalent saturated hydrocarbon group having a carbon atom number of from 2 to 12, an arylene group or a divalent heterocyclic group.

In formula (1), examples of the divalent saturated hydrocarbon group having a carbon atom number of from 2 to 12 represented by $X^1$ include an ethylene group, a trimethylene group, a tetramethylene group, a propylene group, an ethylethylene group, a pentamethylene group, a hexamethylene group, a heptamethylene group, an octamethylene group, a nonamethylene group, a decamethylene group, an undecamethylene group, a dodecamethylene group, a cyclohexylene group (e.g., a 1,6-cyclohexanediyl group), and a cyclopentylene group (e.g., a 1,5-cyclopentanediyl group).

In formula (1), examples of the arylene group having a carbon atom number of from 6 to 12 represented by $X^1$ include a phenylene group, and a naphthylene group.

In formula (1), examples of the divalent group represented by $X^2$ include the same as those denoted in the divalent linkage having a carbon atom number of from 2 to 12 represented by $X^1$. Examples of the divalent group represented by $X^2$ further include those in which up to five methylene groups of the divalent saturated hydrocarbon group above are replaced by oxygen atoms.

In formula (1), examples of the trivalent group represented by $X^2$ include an ethanetriyl group, a propanetriyl group, a butanetriyl group, a pentanetriyl group, a hexanetriyl group, a heptanetriyl group, a octanetriyl group, a nonanetriyl group, a decanetriyl group, an undecanetriyl group, a dodecanetriyl group, a cyclohexanetriyl group, a cyclopentanetriyl group, a benzenetriyl group and a naphthalenetriyl group.

In formula (1), examples of the tetravalent group represented by $X^2$ include a propanediylidene group, a 1,3-propanediyl-2-ylidene group, a butanediylidene group, a pentanediylidene group, a hexanediylidene group, a heptanediylidene group, an octanediylidene group, a nonanediylidene group, a decanediylidene group, an undecanediylidene group, a dodecanediylidene group, a cyclohexanediylidene group, a cyclopentanediylidene group, a benzenetetrayl group and a naphthalenetetrayl group.

In formula (1), examples of the alkyl group represented by Z include a methyl group, an ethyl group, a propyl group, a butyl group, a pentyl group, an isopentyl group, a 2-ethylhexyl group, an octyl group and a decyl group.

In $X^2$ of formula (1), examples of the alkenyl group represented by Z include a 2-propenyl group, a butenyl group, a 1-methyl-3-propenyl group, a 3-pentenyl group, a 1-methyl-3-butenyl group, and a 4-hexenyl group.

In $X^2$ of formula (1), examples of the aryl group represented by Z include a phenyl group, a m-chlorophenyl group, a tolyl group, and a naphthyl group.

In $X^2$ of formula (1), examples of the halogen atom represented by Z include a fluorine atom, a chlorine atom, a bromine atom and an iodine atom.

In $X^2$ of formula (1), examples of the alkoxy group represented by Z include a methoxy group, an ethoxy group, a propoxy group, and a butoxy group.

In $X^2$ of formula (1), examples of the heterocyclic group represented by Z include a pyridyl group, a pyrrolyl group, a 2-methylpyrrolyl group, an indolyl group, an imidazolyl group, a furyl group, a thiazolyl group, and a pyrimidinyl group.

In formula (1), examples of the divalent group having a carbon atom number of from 1 to 5 represented by $D^1$ or $D^2$ include a methylene group, a trimethylene group, a tetramethylene group, a propylene group, an ethylethylene group, a pentamethylene group, and a cyclopentylene group.

In formula (1), examples of the alkylene group having a carbon atom number of from 2 to 12 represented by E are the same as those denoted above in the divalent saturated hydrocarbon group having a carbon atom number of from 2 to 12 represented by $X^1$.

In formula (1), the alkylene groups above include those having as a substituent a 5- to 7-member heterocyclic group. Examples of the 5- to 7-membered heterocyclic include a pyridyl group, a furyl group, a pyrrolyl group, a pyrazolyl group, an imidazolyl group, an oxazolyl group, a thiazolyl group, a pyrimidinyl group, a pyridazinyl group, a pyrranyl group, a thienyl group, an isoxazolyl group, a pyrrolinyl group, an imidazolinyl group ring, a pyrazolidinyl group, a pyrazolinyl group, a piperidinyl group, a piperazinyl group, a morpholyl group, and a quinuclidinyl group.

In formula (1), examples of the arylene group having a carbon atom number of from 2 to 12 represented by E include a phenylene group and a naphthylene group.

Each of the substituents denoted in formula (1) above may further have a substituent.

The content of the compound represented by formula (1) above in the photopolymerizable layer is preferably from 30 to 70% by weight, and more preferably from 40 to 60% by weight. The compound represented by formula (1) above can be synthesized by a known method, for example a method described in Japanese Patent No. 2509288.

Exemplified compounds of the compound represented by formula (1) will be listed below, but the present invention is not limited thereto.

$$R^4{}_{(m-n)}Q^1[CH_2\overset{R^1}{\underset{R^2}{C}}O]_a\text{—}CONH(X^1\text{—}NHCOO)_b\text{—}X^2(OOC\overset{R^3}{C}\text{=}CH_2)_c]_n$$

| Compound No. | $R^4$ | $Q^1$ | m | a | $R^1$ | $R^2$ | b | $X^1$ | $X^2$ | c | $R^3$ | n |
|---|---|---|---|---|---|---|---|---|---|---|---|---|
| 1-1 | — | 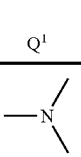 | 3 | 1 | H | H | 0 | — | $C_2H_4$ | 1 | $CH_3$ | 3 |
| 1-2 | — |  | 3 | 1 | $CH_3$ | H | 0 | — | $C_2H_4$ | 1 | $CH_3$ | 3 |
| 1-3 | $C_2H_4OH$ | 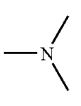 | 3 | 1 | H | H | 0 | — | $C_2H_4$ | 1 | $CH_3$ | 2 |
| 1-4 | — |  | 3 | 1 | H | H | 1 | *1 | $C_2H_4$ | 1 | $CH_3$ | 3 |
| 1-5 | — | 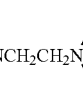 | 4 | 1 | H | H | 0 | — | $C_2H_4$ | 1 | $CH_3$ | 4 |
| 1-6 | — |  | 4 | 1 | $CH_3$ | H | 0 | — | $C_2H_4$ | 1 | $CH_3$ | 4 |

-continued
$$R^4_{(m-n)}Q^1[CH_2\underset{R^2}{\overset{R^1}{C}}O]_a-CONH(X^1-NHCOO)_b-X^2(OOC\underset{}{\overset{R^3}{C}}=CH_2)_c]_n$$
| Compound No. | R⁴ | Q¹ | m | a | R¹ | R² | b | X¹ | X² | c | R³ | n |
|---|---|---|---|---|---|---|---|---|---|---|---|---|
| 1-7 | — | —N(CH₃)₂ | 3 | 1 | H | H | 0 | — | C₃H₆ | 1 | CH₃ | 3 |
| 1-8 | — | (CH₃)₂NCH₂CH₂N(CH₃)₂ | 4 | 1 | H | H | 0 | — | C₃H₆ | 1 | CH₃ | 4 |
| 1-9 | — | —N(CH₃)₂ | 3 | 1 | H | H | 0 | — | C₂H₄ | 1 | H | 3 |
| 1-10 | — | (CH₃)₂NCH₂CH₂N(CH₃)₂ | 4 | 1 | H | H | 0 | — | C₂H₄ | 1 | H | 4 |
| 1-11 | — | —S— | 2 | 1 | H | H | 0 | — | C₂H₄ | 1 | CH₃ | 2 |
*1: 2,2,4-trimethylhexamethylene
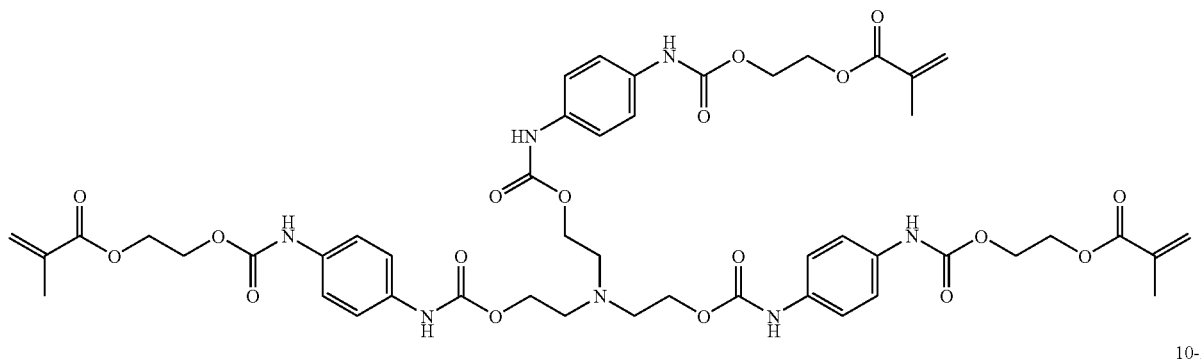
10-1
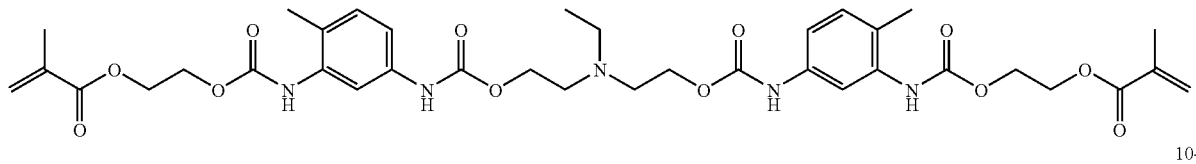
10-2
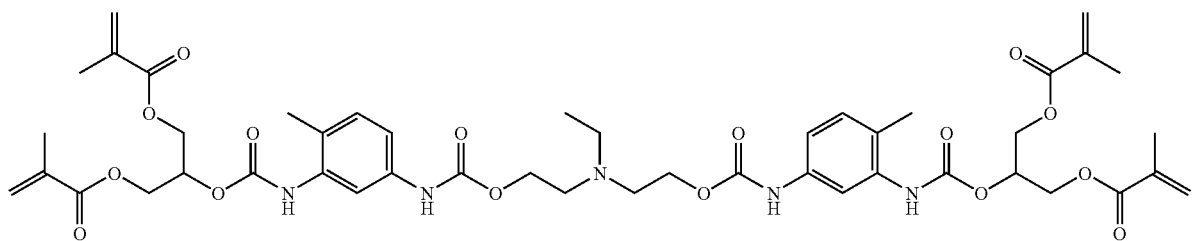
10-3

10-4
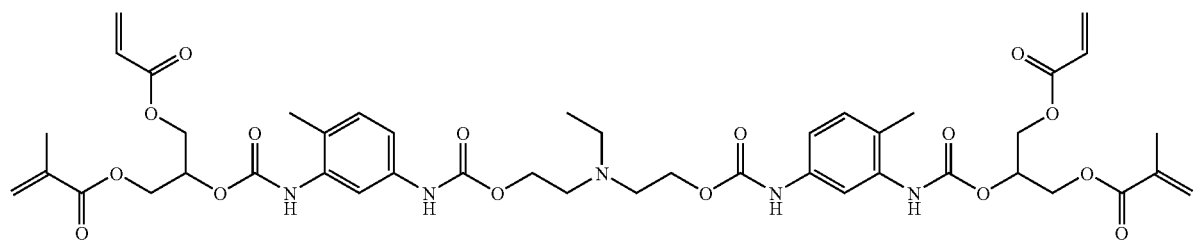
10-5
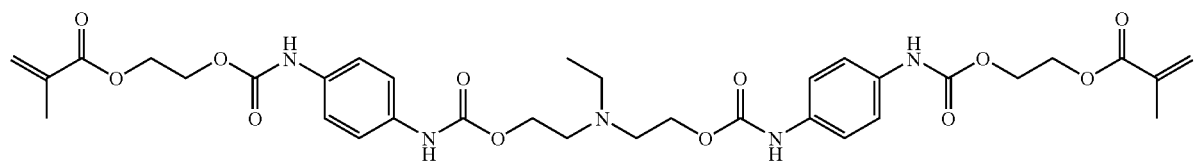
10-6
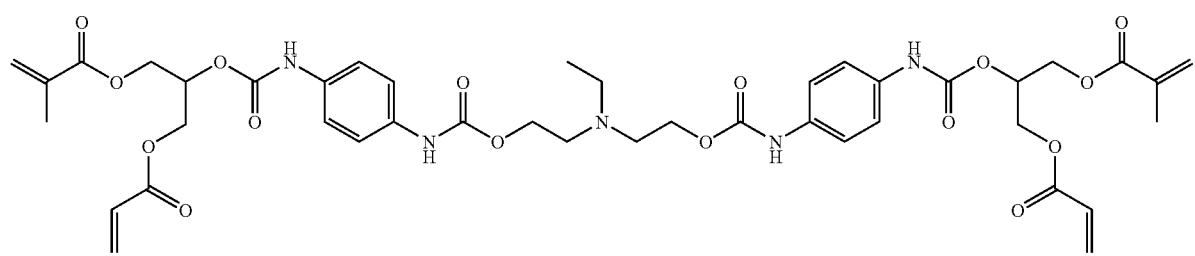
10-7
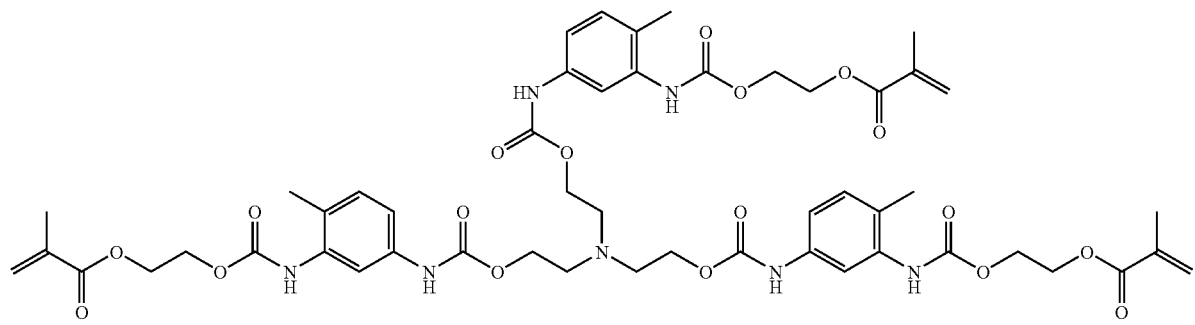
10-8
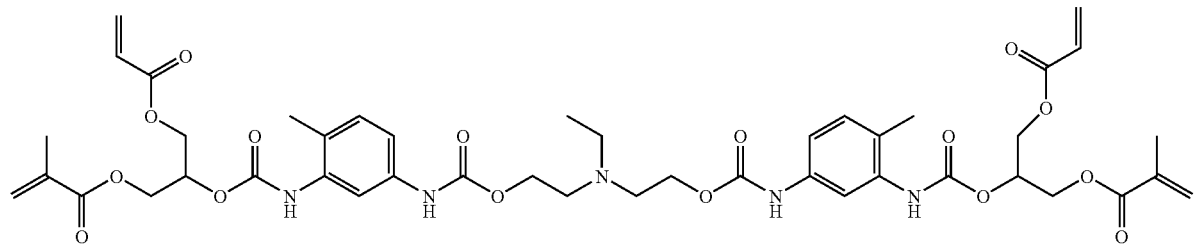
10-9
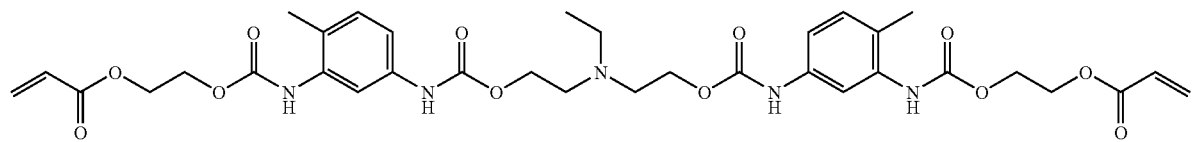

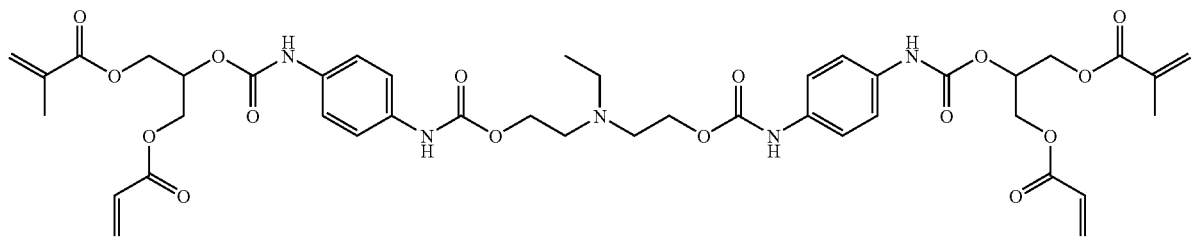

10-10

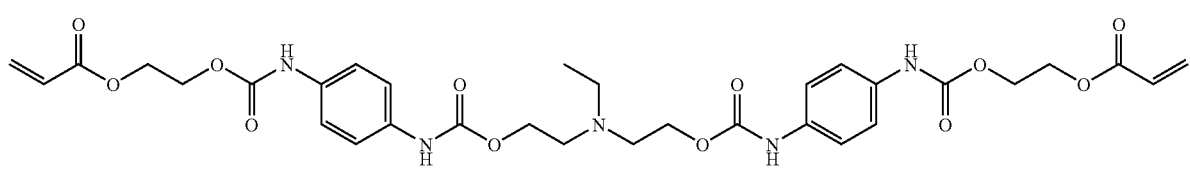

10-11

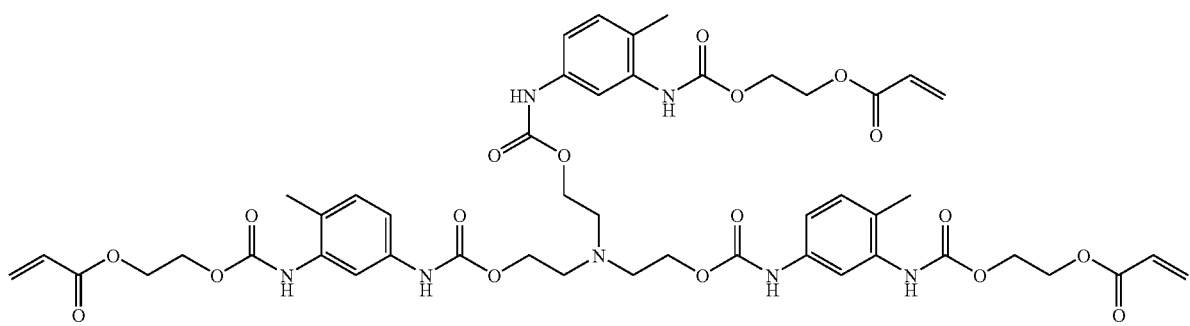

10-12

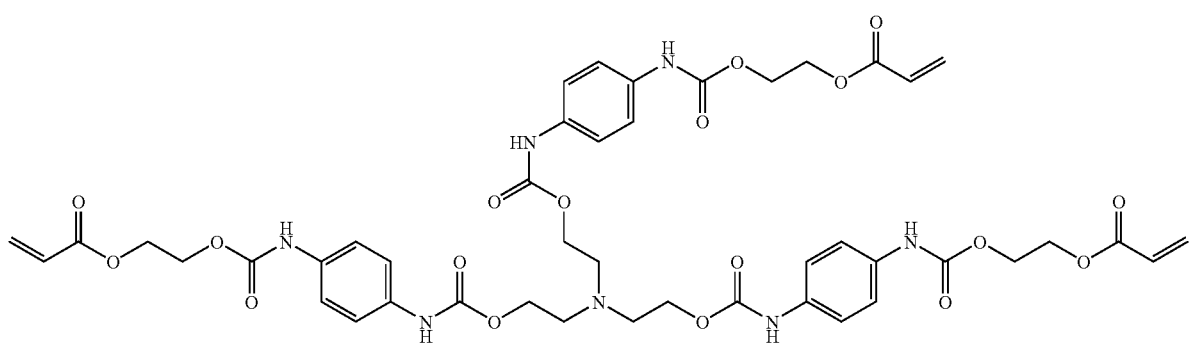

10-13

The compound represented by formula (2) in the invention will be detailed below.

In formula (2), $R^8$ represents an alkyl group, a hydroxyalkyl group, or an aryl group. When (g-f) is two or more, plural $R^8$'s may be the same or different. It is preferred that g and f are the same. When $R^8$ is an alkyl group, or a hydroxyalkyl group, $R^8$ has a carbon atom number of preferably from 2 to 8, more preferably from 2 to 4. When $R^8$ is an aryl group, $R^8$ is preferably monocyclic or bicyclic, and more preferably monocyclic. The aryl groups include those having a substituent such as an alkyl group, an alkoxy group or a halogen atom.

In formula (2), $R^5$ and $R^6$ independently represent a hydrogen atom, an alkyl group, or an alkoxy group. When $R^5$ and $R^6$ independently represent an alkyl group, or an alkoxy group, $R^5$ and $R^6$ independently has a carbon atom number of preferably from 1 to 5.

$R^7$ is preferably a methyl group. $D^3$ and $D^4$ may be the same or different, and $D^3$ and $D^4$ are preferably 6-member saturated heterocyclic groups having two nitrogen atoms, respectively.

F represents a saturated hydrocarbon group having a carbon atom number of from 2 to 12 or an arylene group having a carbon atom number of from 6 to 12. When F is the saturated hydrocarbon group, F has a carbon atom number of preferably from 2 to 6, and for example, ethylene, propylene, or cyclohexylene is preferred. When F is the arylene group, F is preferably phenylene.

In order to prepare a compound of formula (2) in which $Q^2$ is N, and n and m are the same, for example, glycidylacrylate or hydroxyacrylate is reacted with alkylamine.

Exemplified compounds of the compound represented by formula (2) will be listed below.

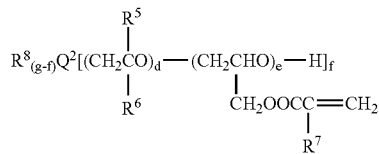

| Compound No. | R⁸ | Q² | g | d | R⁵ | R⁶ | e | R⁷ | f |
|---|---|---|---|---|---|---|---|---|---|
| 2-1 | — | —N< | 3 | 1 | H | H | 1 | CH₃ | 3 |
| 2-2 | — | —N< | 3 | 1 | CH₃ | H | 1 | CH₃ | 3 |
| 2-3 | CH₂CH₂OH | —N< | 3 | 1 | H | H | 1 | CH₃ | 2 |
| 2-4 | — | —N< | 3 | 1 | CH₃ | H | 1 | H | 3 |
| 2-5 | — | >NCH₂CH₂N< | 4 | 1 | H | H | 1 | CH₃ | 4 |
| 2-6 | — | >NCH₂CH₂N< | 4 | 1 | CH₃ | H | 1 | CH₃ | 4 |
| 2-7 | C₆H₅ | —N< | 3 | 1 | H | H | 1 | H | 2 |
| 2-8 | — | >NCH₂CH₂N< | 4 | 1 | CH₃ | H | 1 | H | 4 |
| 2-9 | — | —N< | 3 | 1 | H | H | 1 | H | 3 |
| 2-10 | — | >NCH₂CH₂N< | 4 | 1 | H | H | 1 | H | 4 |
| 2-11 | — | —S— | 2 | 1 | H | H | 1 | CH₃ | 2 |
| 2-12 | — | *2 | 4 | 1 | H | H | 1 | CH₃ | 4 |

*2 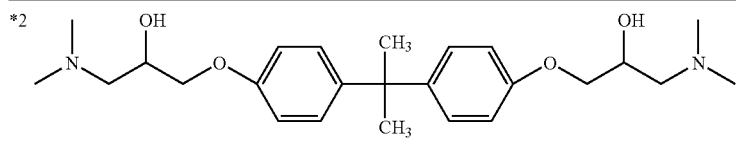

The content of the compound represented by formula (2) above in the photopolymerizable layer is preferably from 30 to 70% by weight, and more preferably from 40 to 60% by weight.

The alkyl, alkenyl, aryl or heterocyclic group represented by $R_1$, $R_2$, $R_3$, and $R_4$ of formula (3) is the same as those denoted in Z of formula (1). The aralkyl group represented by $R_1$, $R_2$, $R_3$, and $R_4$ of formula (3) is a benzyl group or a phenethyl group. The aralkyl group represented by $R_1$, $R_2$, $R_3$, and $R_4$ of formula (3) is a benzyl group or a phenethyl group. The alkinyl group represented by $R_1$, $R_2$, $R_3$, and $R_4$ of formula (3) is an ethinyl group or a propinyl group. Exemplified compounds of the compound represented by formula (3) will be listed below, but the present invention is not limited thereto.

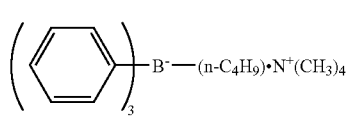 (1)

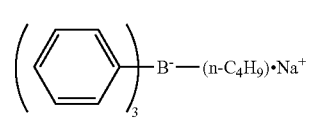 (1-i)

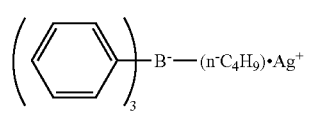 (1-ii)

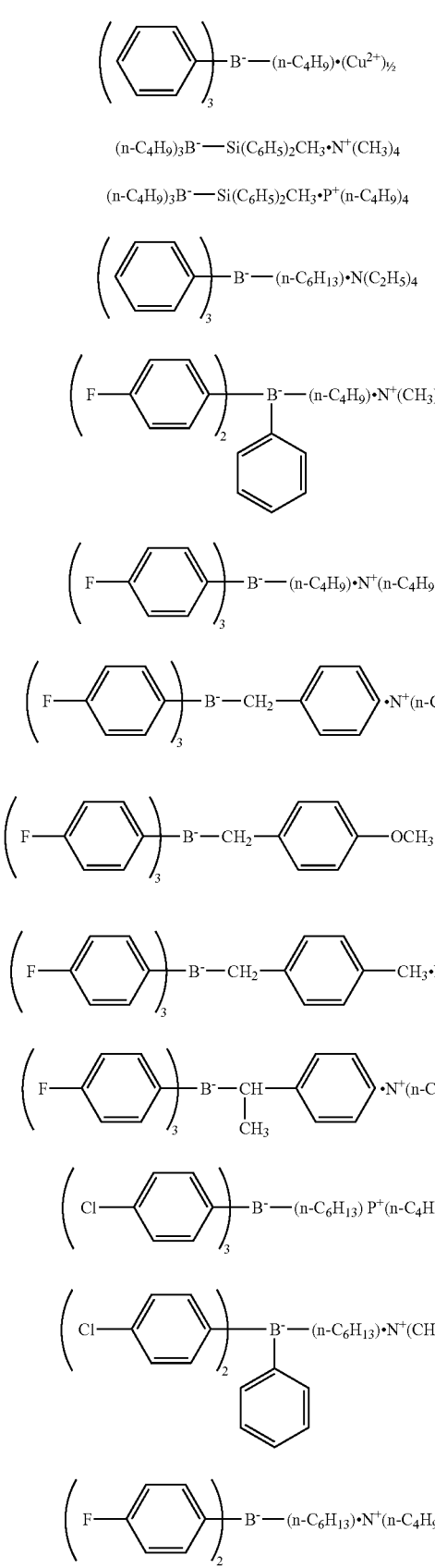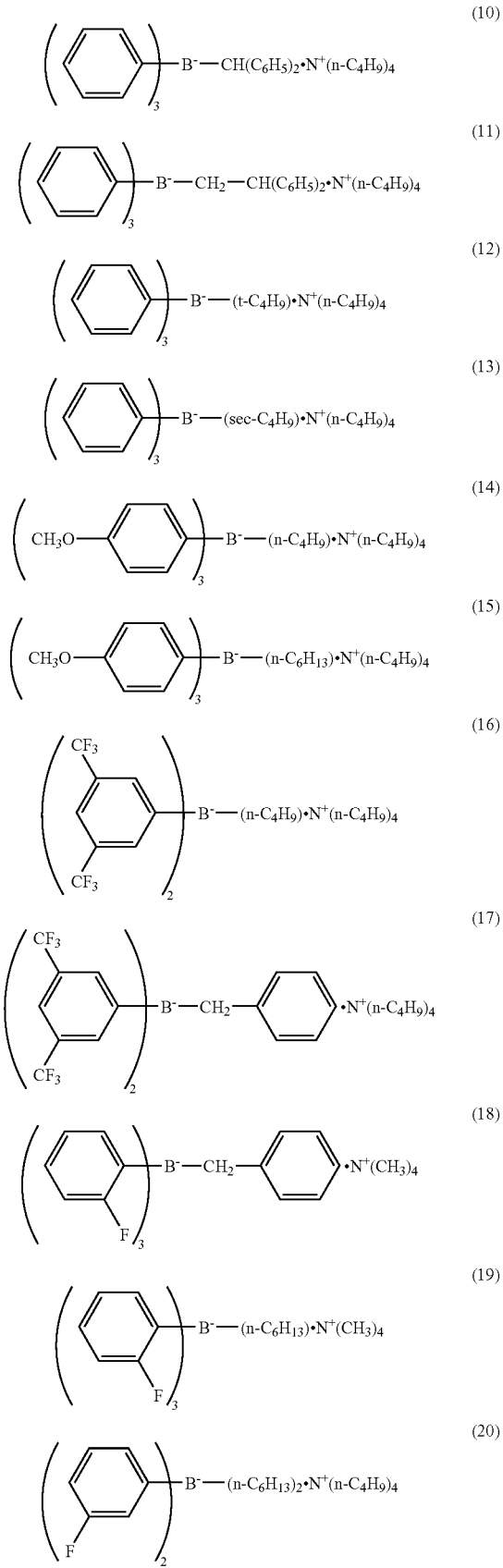

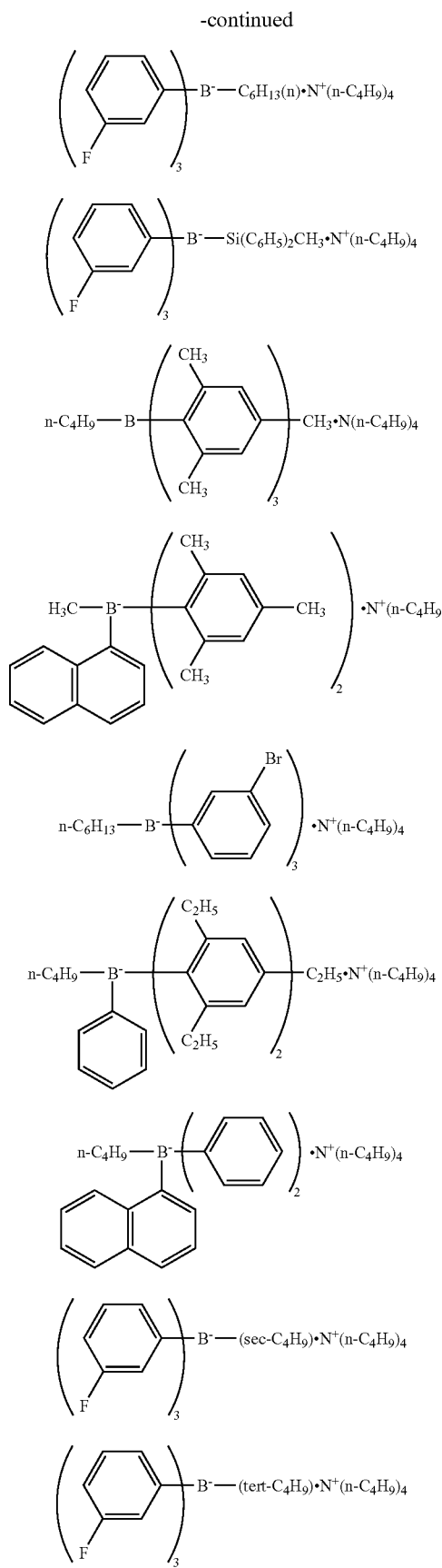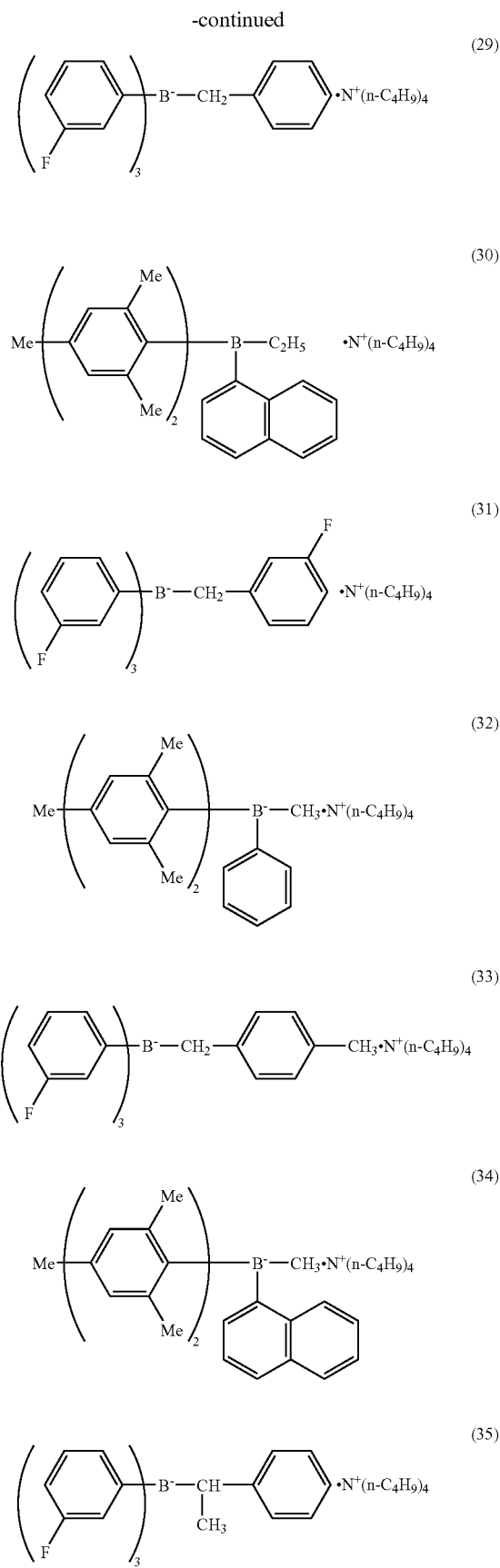

-continued

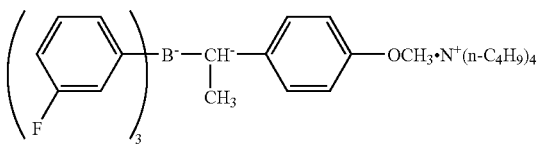
(36)

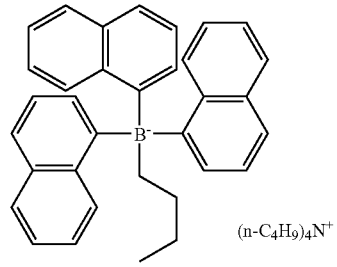
(37)

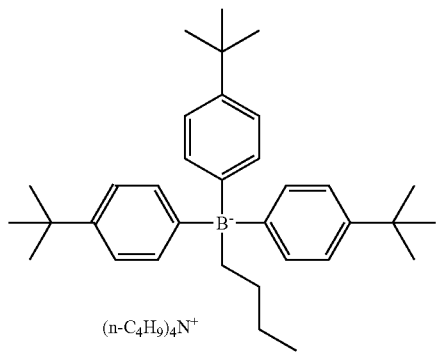
(38)

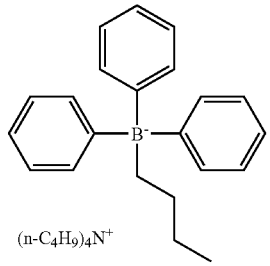
(39)

Examples of the compound represented by formula (4) include (η6-benzene)(η5-cyclopentadienyl)iron(2) hexafluorophosphate, (η6-toluene)(η5-cyclopentadienyl)iron(2) hexafluorophosphate, (η6-cumene)(η5-cyclopentadienyl)iron(2) hexafluorophosphate, (η6-benzene)(η5-cyclopentadienyl)iron(2) hexafluoroarsenate, (η6-benzene) (η5-cyclopentadienyl)iron(2) tetrafluoroborate, (η6-naphthalene) (η5-cyclopentadienyl)iron(2) hexafluorophosphate, (η6-anthracene)(η5-cyclopentadienyl)iron(2) hexafluorophosphate, (η6-pyrene)(η5-cyclopentadienyl)iron(2) hexafluorophosphate, (η6-benzene)(η5-cyanocyclopentadienyl)iron(2) hexafluorophosphate, (η6-toluene) (η5-acetylcyclopentadienyl)iron(2) hexafluorophosphate, (η6-cumene) (η5-cyclopentadienyl)iron(2) tetrafluoroborate, (η6-benzene)(η5-carboethoxycyclohexadienyl)iron(2) hexafluorophosphate, (η6-benzene)(η5-1,3-dichlorocyclohexadienyl)iron(2) hexafluorophosphate, (η6-acetophenone) (η5-cyclohexadienyl)iron(2) hexafluorophosphate, (η6-methyl benzoate)(η5-cyclopentadienyl)iron(2) hexafluorophosphate, (η6-benzene sulfonamide)(η5-cyclopentadienyl)iron(2) tetrafluoroborate, (η6-benzamide)(η5-cyclopentadienyl)iron(2) hexafluorophosphate, (η6-cyanobenzene)(η5-cyanocyclopentadienyl)iron(2) hexafluorophosphate, (η6-chloronaphthalene)(η5-cyclopentadienyl)iron(2) hexafluorophosphate, (η6-anthracene)(η5-cyanocyclopentadienyl)iron(2) hexafluorophosphate, (η6-chlorobenzene)(η5-cyclopentadienyl)iron(2) hexafluorophosphate, and (η6-chlorobenzene)(η5-cyclopentadienyl)iron(2) tetrafluoroborate. These compounds can be synthesized according to a method described in Dokl. Akd. Nauk. SSSR 149 615 (1963).

The photopolymerizable layer in the light sensitive planographic printing plate precursor of the invention preferably contains a sensitizing dye. Examples of the known sensitizing dyes, which can induce sensitivity to the wavelengths of the visible and near infrared regions, include cyanines, phthalocyanines, merocyanines, porphyrins, spiro compounds, ferrocenes, fluorenes, fulgides, imidazoles, perylenes, phenazines, phenothiazines, polyenes, azo compounds, diphenylmethanes, triphenylmethanes, polymethine acridines, cumarines, ketocumarines, quinacridones, indigos, styryl dyes, pyrylium dyes, pyrromethene dyes, pyrazolotriazole compounds, benzothiazole compounds, barbituric acid derivatives, thiobarbituric acid derivatives, and compounds disclosed in European Patent No. 568,993, U.S. Pat. Nos. 4,508,811 and 5,227,227, and Japanese Patent O.P.I. Publication Nos. 2001-125255 and 11-271969.

The sensitizing dye used in the invention is preferably a sensitizing dye having an absorption maximum in the wavelength regions of from 350 to 450 nm, and more preferably a compound represented by the following formula (5), (6), (7), or (8). In the invention, λmax (a wavelength providing an absorption maximum) of the sensitizing dye is measured in methanol as a main solvent, employing a spectrophotometer U-3300 (produced by Hitachi Co., Ltd.).

Formula (5)

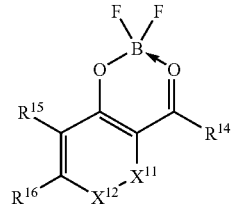

In formula (5), $R^{14}$ represents a hydrogen atom, an alkyl group, an alkenyl group, an aryl, or a heterocyclic group; $R^{15}$ and $R^{16}$ combine with each other to form a ring; and $X^{11}$ and $X^{12}$ independently represent —$CR^{17}R^{18}$—, —O—, —S—, or —$NR^{19}$—, in which $R^{17}$, $R^{18}$, and $R^{19}$ independently represent a hydrogen atom, an alkyl group, an alkenyl group, an aryl group, or a heterocyclic group.

Examples of the alkyl group represented by $R^{14}$ include a methyl group, an ethyl group, a propyl group, a butyl group, a hexyl group, an octyl group, a decyl group, a dodecyl group, an isopropyl group, an isobutyl group, an isopentyl group, a tert-butyl group or a 2-ethylhexyl group. Examples of the alkenyl group represented by $R^{14}$ include a vinyl group, a 2-propenyl group, or a 3-butenyl group, a 1-methyl-3-propenyl group, 3-pentenyl group, a 1-methyl-3-butenyl group, and a 4-hexenyl group. Examples of the aryl group represented by $R^{14}$ include a phenyl group, a naphthyl group, or an aralkyl group such as a benzyl group or phenethyl group. Examples of the heterocyclic group represented by $R^{14}$ include a pyrrolyl group, an imidazolyl group, a pyrazolyl group, an oxazolyl group, a thiazolyl group, an oxadiazolyl group, a thiadiazolyl group, a benzoimidazolyl group, a pyridyl group, a furyl group, a thienyl group, a chromanyl group, a coumarinyl group, a pyrrolidinyl group, a piperidinyl group, a morpholinyl group, a sulfolanyl group, a tetrahydrofuryl group, and a tetrahydropyranyl group.

Examples of the alkyl group, the alkenyl group, the aryl group or the heterocyclic group represented by $R^{17}$, $R^{18}$, or $R^{19}$ are the same as those denoted in $R^{14}$ above.

The spectral sensitizing dye represented by formula (5) in the invention can be prepared according to conventional synthetic methods well known in the art.

Examples of the sensitizing dye represented by formula (5) are listed below, but are not limited thereto.

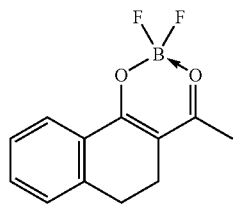
5-1

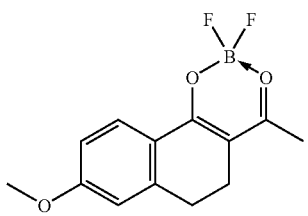
5-2

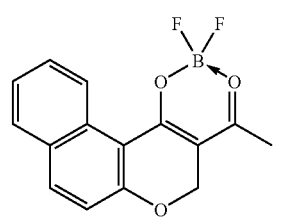
5-3

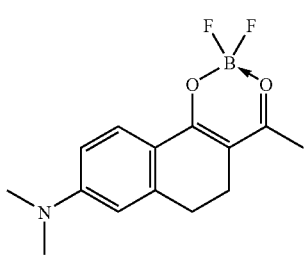
5-4

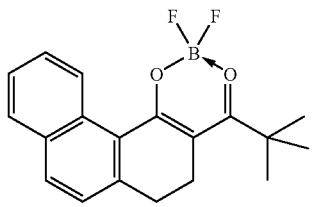
5-5

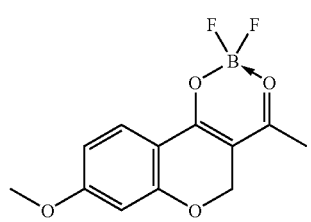
5-6

A compound represented by formula (6) will be explained below.

The aromatic hydrocarbon group represented by A represents a phenyl group, a naphthyl group, a pentalenyl group, an indenyl group, an azulenyl group, a fluorenyl group, a phenanthrenyl group, or an anthracenyl group.

The heterocyclic group represented by A represents a furyl group, pyrrolyl group, a pyrazolyl group, an imidazolyl group, an oxazolyl group, a thiazolyl group, a 1,2,3-oxazolyl group, a 1,2,3-triazolyl group, a 1,2,4-triazolyl group, a 1,3,4-thiadiazolyl group, a pyridinyl group, a pyridazinyl group, a pyrimidyl group, a pyrazinyl group, an s-triazinyl group, a benzofuryl group, an indolyl group, a benzothienyl group, a benzimidazolyl group, a benzothiazolyl group, a purinyl group, a quinolyl group, an isoquinolyl group, a morpholinyl group, a pyrazolinyl group, a piperidinyl group, an indolinyl group, a pyrrolinyl group, an imidazolidinyl group, and an indolidinyl group.

The substituent represented by $R_{11}$, $R_{12}$, and $R_{13}$ represents an alkyl group, an alkenyl group, an aryl group, an aromatic heterocyclic group, an alkoxy group, an alkylthio group, a hydroxyl group or a halogen atom.

The alkyl group, alkenyl group, and aryl group represented by $R_{11}$, $R_{12}$, and $R_{13}$ represent the alkyl group, alkenyl group, and aryl group denoted in $R^{14}$ of formula (5), respectively.

The aromatic heterocyclic group represented by $R_{11}$, $R_{12}$, and $R_{13}$ represents a furyl group, a pyrrolyl group, a pyrazolyl group, an imidazolyl group, an oxazolyl group, a thiazolyl group, pyridyl group, a pyridazinyl group, a pyrimidinyl group, a pyrazinyl group.

The alkoxy group represented by $R_{11}$, $R_{12}$, and $R_{13}$ represents a methoxy group, an ethoxy group, or a propoxy group.

The alkylthio group represented by $R_{11}$, $R_{12}$, and $R_{13}$ represents a methylthio group, an ethylthio group, a propylthio group or a pentylthio group.

The halogen atom represented by $R_{11}$, $R_{12}$, and $R_{13}$ represents fluorine, chlorine, bromine or iodine.

Examples of the compound represented by formula (6) will be listed below; but the present invention is not limited thereto.

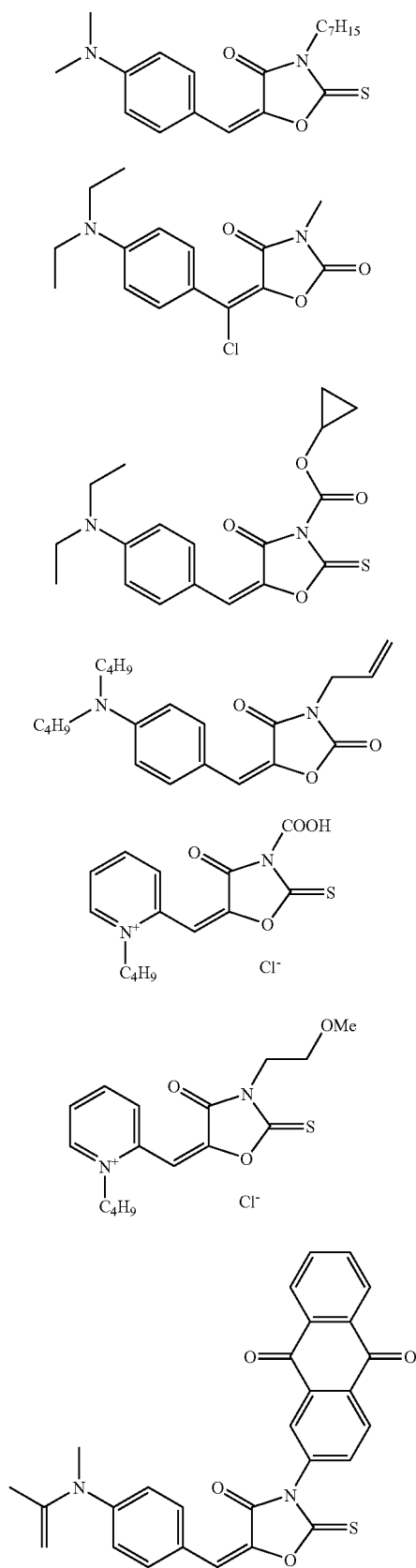

-continued

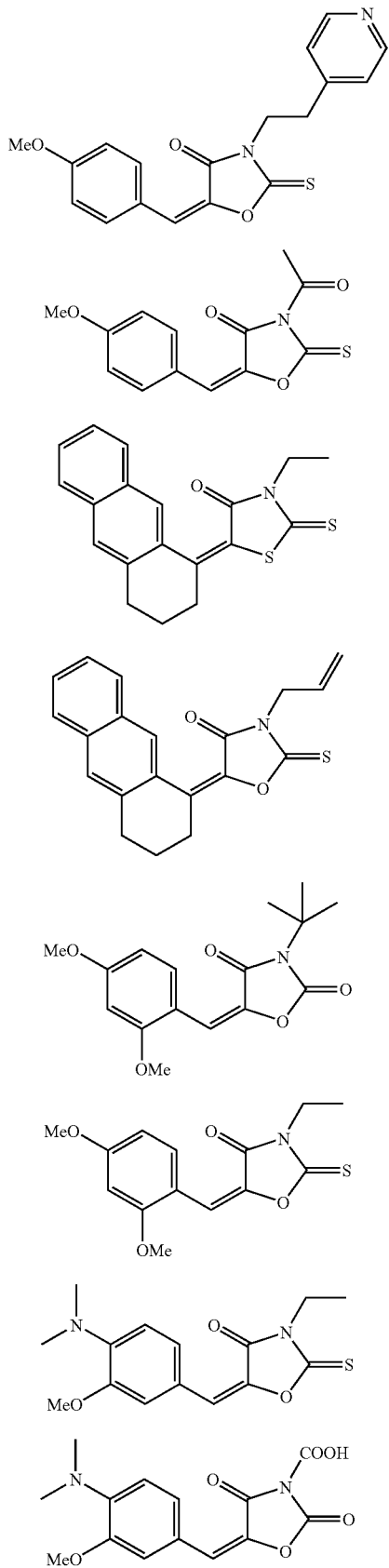

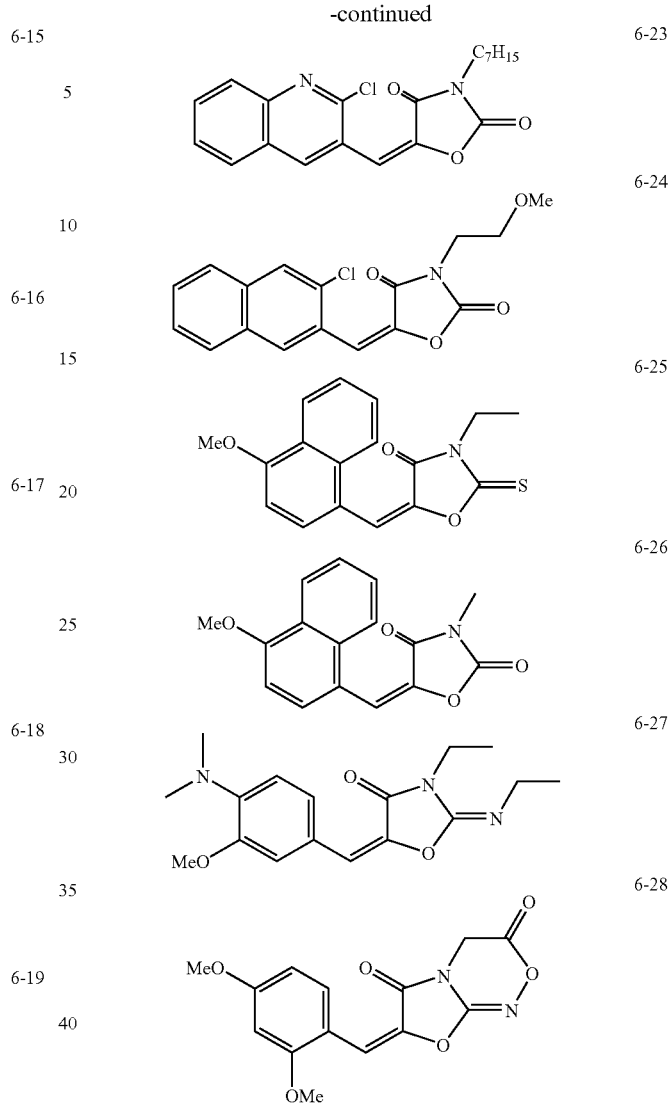

A compound represented by formula (6) will be explained below.

In formula (7), the substituent represented by $R^{11}$, $R^{12}$, $R^{13}$, $R^{14}$, $R^{15}$, $R^{16}$, $R^{17}$, $R^{18}$, and $R^{18}$ are the same as those denoted in $R_{11}$, $R_{12}$, and $R_{13}$ of formula (6) above.

In formula (7), two adjacent groups of $R^{11}$, $R^{12}$, $R^{13}$, $R^{14}$, $R^{15}$, $R^{16}$, $R^{17}$, $R^{18}$, and $R^{18}$ may combine with each other to form a ring which is a non-aromatic hydrocarbon group, an aryl group, or a heterocyclic group.

Examples of the non-aromatic hydrocarbon group include a cyclohexyl group, a cyclobutyl group, a cyclopentyl group, and a cyclocytl group. Examples of the aryl group include a phenyl group, a naphthyl group, a pentalenyl group, an indenyl group, an azulenyl group, a fluorenyl group, a phenenthrenyl group and a anthracenyl group. Examples of the heterocyclic group include a furyl group, a pyrrolyl group, a pyrazolyl group, an imidazolyl group, an oxazolyl group, a thiazolyl group, a 1,2,3-oxathiazolyl group, a 1,2,3-triazolyl group, a 1,2,4-triazolyl group, a 1,3,4-thiadiazolyl group, a pyridyl group, a pyridazinyl group, a pyrimidinyl group, a pyrazinyl group, an s-triazinyl group, a benzofuryl group, an indolyl group, a beozothienyl group, a beozimidazolyl group, a benzothiazolyl group, a purinyl group, a quinolinyl group and an isoquinolinyl group.

In formula (7), when $R^{11}$ is represented by formula P, $R^{10}$ may combine with $R^{12}$ or $R^{19}$ to form a ring, when $R^{13}$ is represented by formula P, $R^{10}$ may combine with $R^{12}$ or $R^{14}$ to form a ring, and when $R^{11}$ and $R^{13}$ both are represented by formula P, $R^{10}$ may combine with $R^{14}$ or $R^{19}$ to form a ring. The ring herein referred to represents a non-aromatic hydrocarbon group, an aryl group, or a heterocyclic group. Examples of the non-aromatic hydrocarbon group, aryl group, or a heterocyclic group are the same as those denoted above.

In formula p, Z represents a non-metallic atomic group necessary to form a 5-member acidic nucleus. Herein, definition of "acidic ring" is one described in the eighth paragraph of T. M. James, "The Theory of The Photographic Process", fourth edition, published by Macmillan. A sensitizing dye represented by a merocyanine dye generally has a basic (electron donating) heterocyclic ring and an acidic (electron withdrawing) heterocyclic ring in the molecular ends. The basic (electron donating) heterocyclic ring is called a basic nucleus, and the acidic (electron withdrawing) heterocyclic ring is called an acidic nucleus. Examples of the basic or acidic nucleus are the same as those listed in the eighth paragraph of T. M. James, "The Theory of The Photographic Process", fourth edition, published by Macmillan.

Examples of the acidic nucleus include a 1,3-dicarbonyl nucleus (for example, 1,3-indanedione, or 1,3-dioxane-4,6-dione), a pyrazolinone nucleus (for example, 3-methyl-1-phenyl-2-pyrazoline-5-one, 1-phenyl-2-pyrazoline-5-one, or 1-(2-benzothiazolyl)-3-methyl-2-pyrazoline-5-one), an isoxazolinone nucleus (for example, 3-phenyl-2-isoxazoline-5-one, or 3-methyl-2-isoxazoline-5-one), an oxyindole nucleus (for example, 1-alkyl-2,3-dihydro-2-oxyindole), a 2-thio-2, 4-dithiazolidinedione nucleus (for example, a rhodanine or its N-substituted derivative such as 3-methylrohdanine, 3-ethylrohdanine, 3-phenylrohdanine, 3-allylrohdanine, 3-benzylrohdanine, 3-carboxymethylrohdanine, 3-carboxyethylrohdanine, 3-methoxycarbonylmethylrohdanine, 3-hydroxyethylrohdanine, or 3-morpholinoethylrohdanine), a 2-thio-2,4-oxazolidinedione nucleus (for example, 2-thio-2,4-(3H,4H)-oxazoledione such as 2-ethyl-2-thio-2,4-oxazolidinedione), a thianaphthenone nucleus (for example, 3(2H)-thianaphthenone or 3(2H)-thianaphthenone-1,1-dioxide), a 2-thio-2,5-thiazolidinedione nucleus (for example, 3-ethyl-2-thio-2,5-thiazolidinedione), a 2,4-thiazolidinedione nucleus (for example, 2,4-thiazolidinedione, 3-ethyl-2,4-thiazolidinedione, or 3-phenyl-2,4-thiazolidinedione), a thiazolidinone nucleus (for example, 4-thiazolidinone, 3-ethyl-4-thiazolidinone, 2-ethylmercapto-4-thiazolidinone, or 2-methylphenylamino-4-thiazolidinone), a 2-imino-2-oxazoline-4-one nucleus (i.e., a pseudo-hydantoin nucleus), a 2,4-imidazolidinedione nucleus (i.e., a hydantoin nucleus, for example, 2,4-imidazolidinedione, 3-ethyl-2,4-imidazolidinedione, or 1,3-diethyl-2,4-imidazolidinedione), a 2-thio-2,4-imidazolidinedione nucleus (i.e., a thiohydantoin nucleus, for example, 2-thio-2,4-imidazolidinedione, 3-ethyl-2-thio-2,4-imidazolidinedione, or 1,3-diethyl-2-thio-2,4-imidazolidinedione), an imidazoline-5-one nucleus (for example, 2-propylmercapto-2-imidazoline-5-one.

Examples of the compound represented by formula (7) will be listed below; but the present invention is not limited thereto.

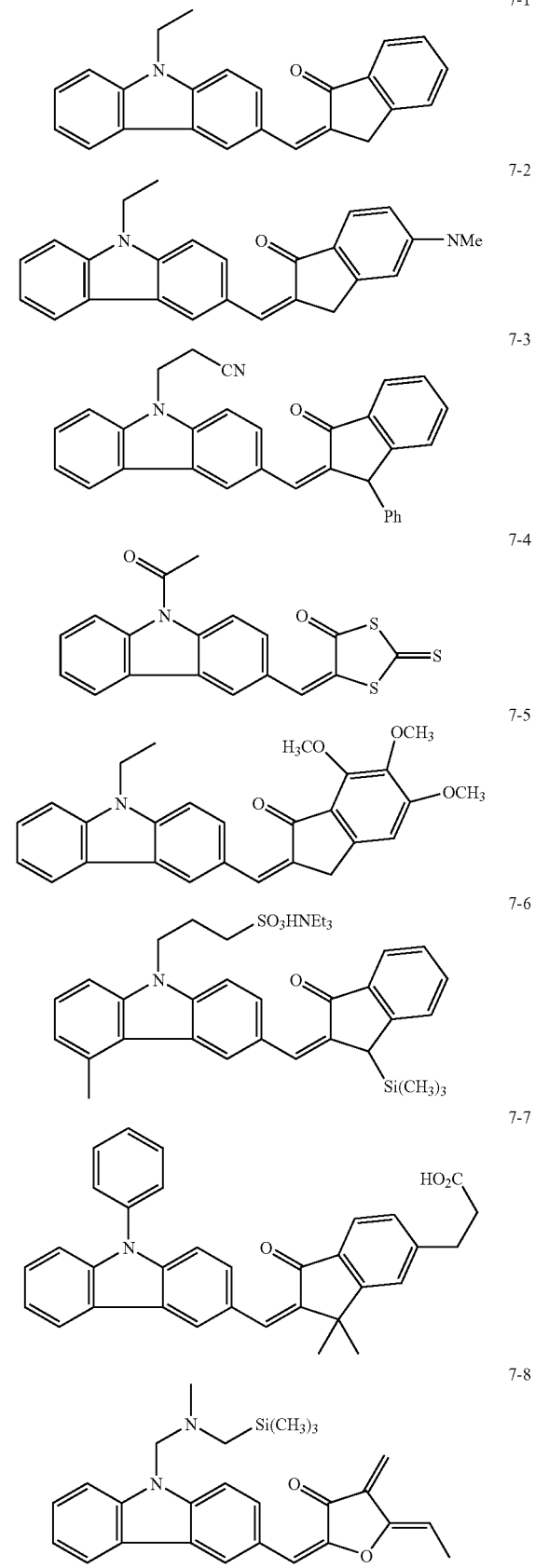

-continued
7-9
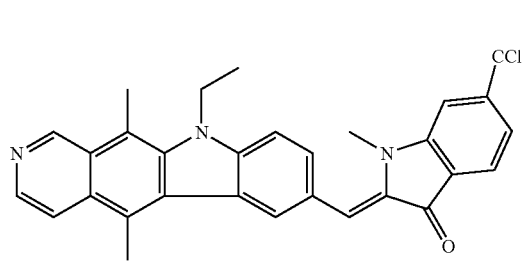
7-10
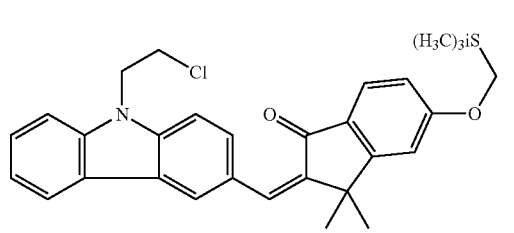
7-11
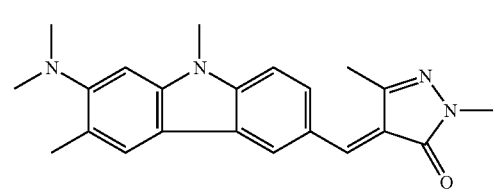
7-12
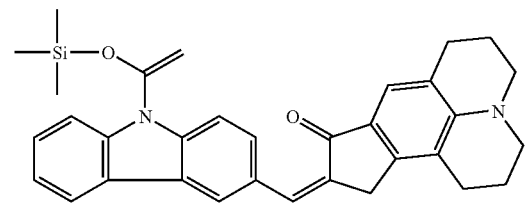
7-13
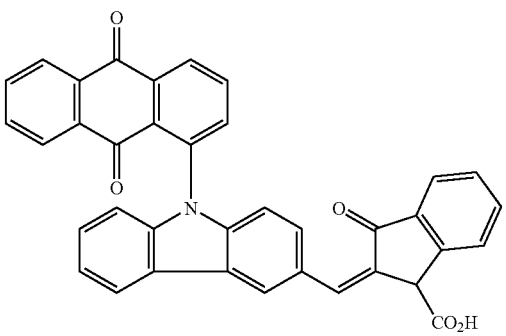
7-14
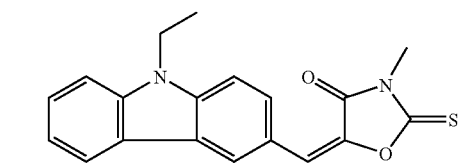
-continued
7-15
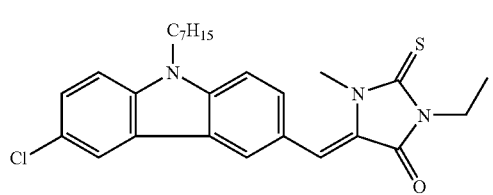
7-16
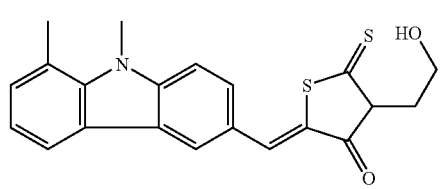
7-17
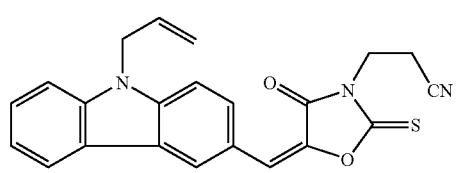
7-18
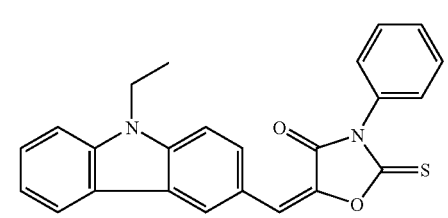
7-19
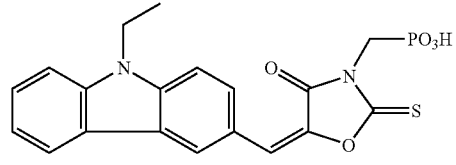
7-20
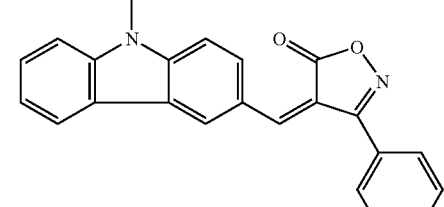
7-21
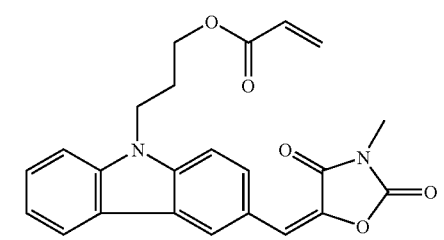

-continued 7-22
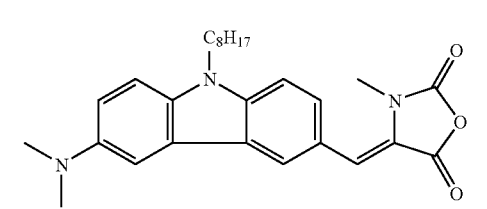

7-23
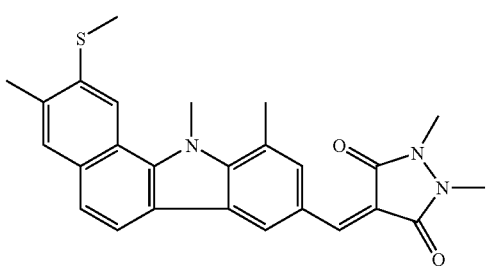

7-24
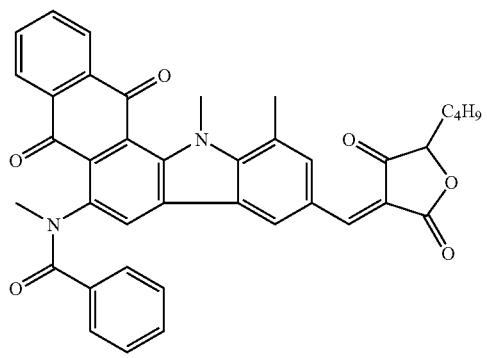

7-25
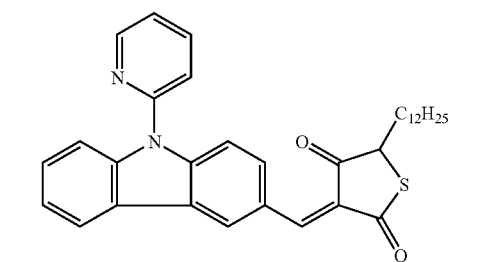

7-26
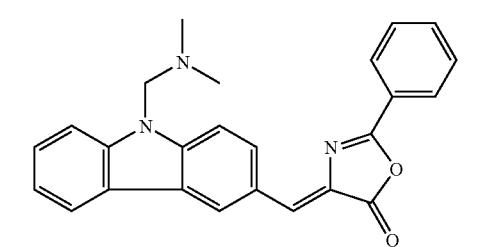

7-27
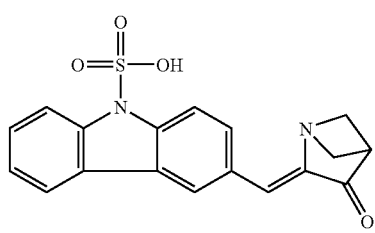

-continued 7-28
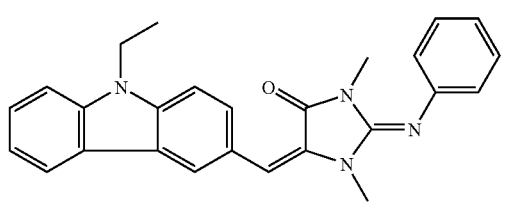

7-29
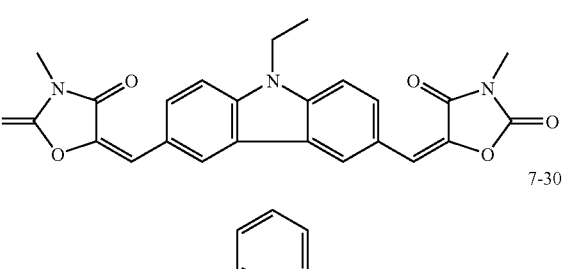

7-30
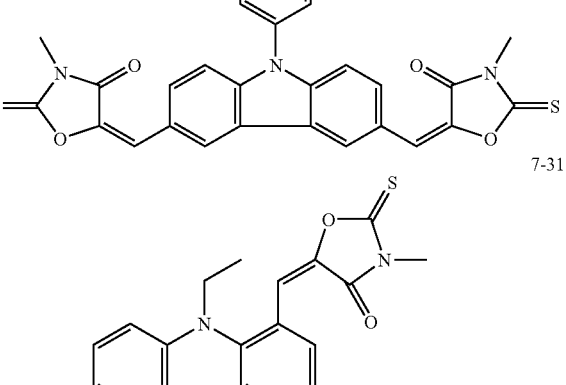

7-31
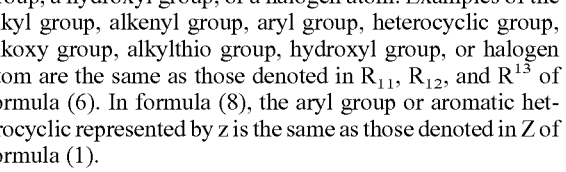

A compound represented by formula (8) will be explained below.

In formula (8), the substituent represented by $X_1$, $X_2$, $X_3$, $X_4$ and $X_5$ represents an alkyl group, an alkenyl group, an aryl group, a heterocyclic group, an alkoxy group, an alkylthio group, a hydroxyl group, or a halogen atom. Examples of the alkyl group, alkenyl group, aryl group, heterocyclic group, alkoxy group, alkylthio group, hydroxyl group, or halogen atom are the same as those denoted in $R_{11}$, $R_{12}$, and $R^{13}$ of formula (6). In formula (8), the aryl group or aromatic heterocyclic represented by z is the same as those denoted in Z of formula (1).

Examples of the compound represented by formula (8) will be listed below; but the present invention is not limited thereto.

8-1
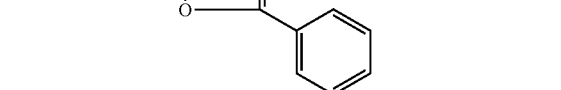

8-2
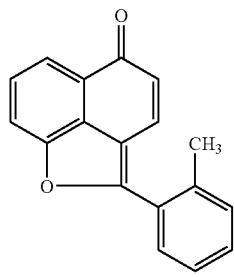
8-3
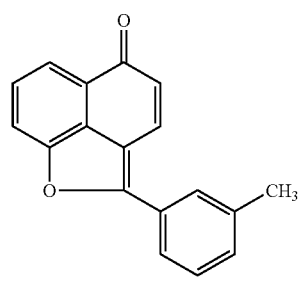
8-4
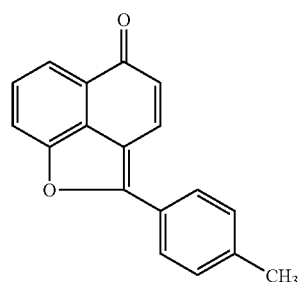
8-5
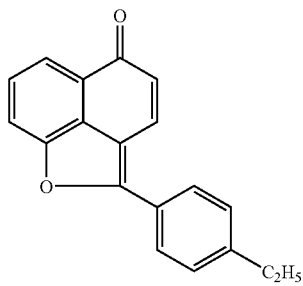
8-6
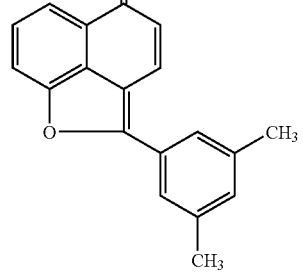
8-7
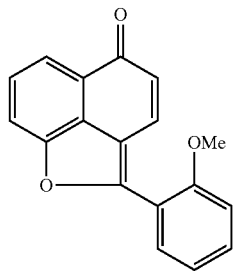
8-8
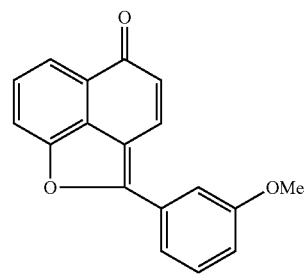
8-9
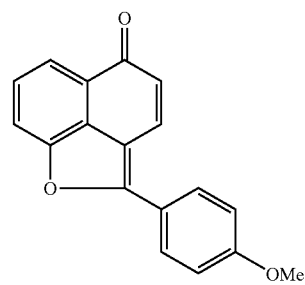
8-10
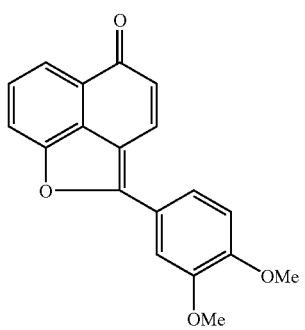
8-11
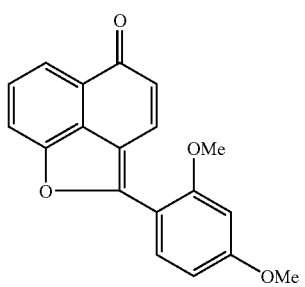

-continued
8-12
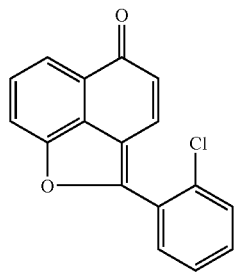
8-13
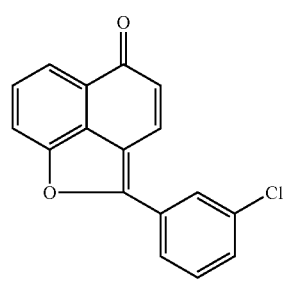
8-14
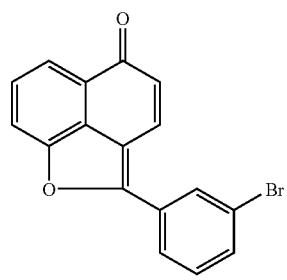
8-15
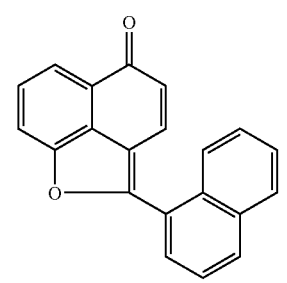
8-16
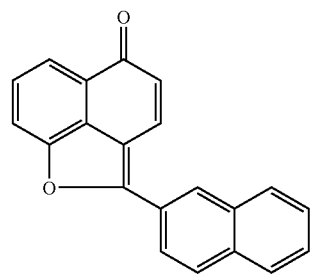
-continued
8-17
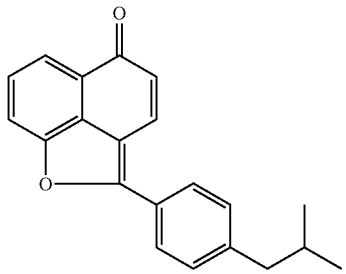
8-18
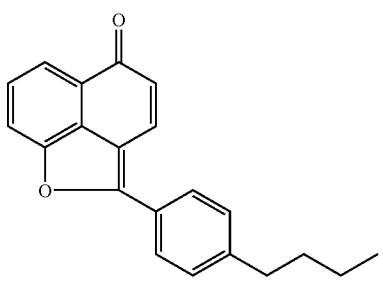
8-19
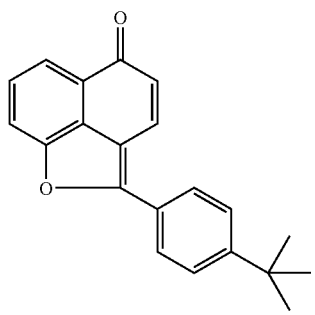
8-20
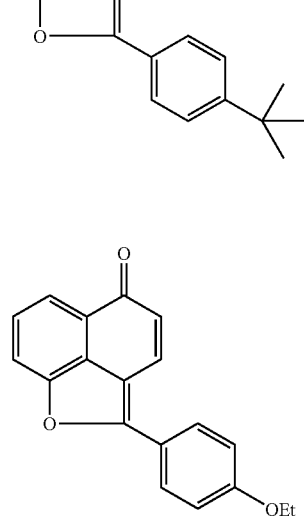
8-21
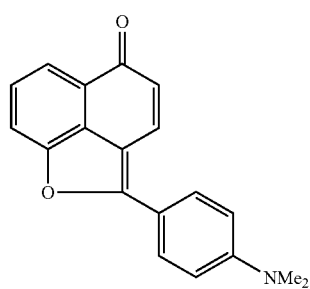

-continued
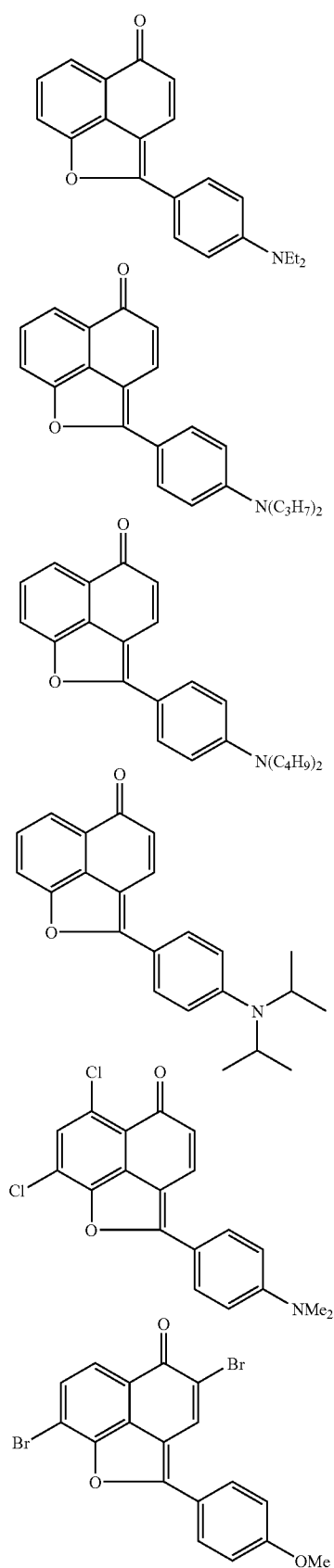
8-22
8-23
8-24
8-25
8-26
8-27
-continued
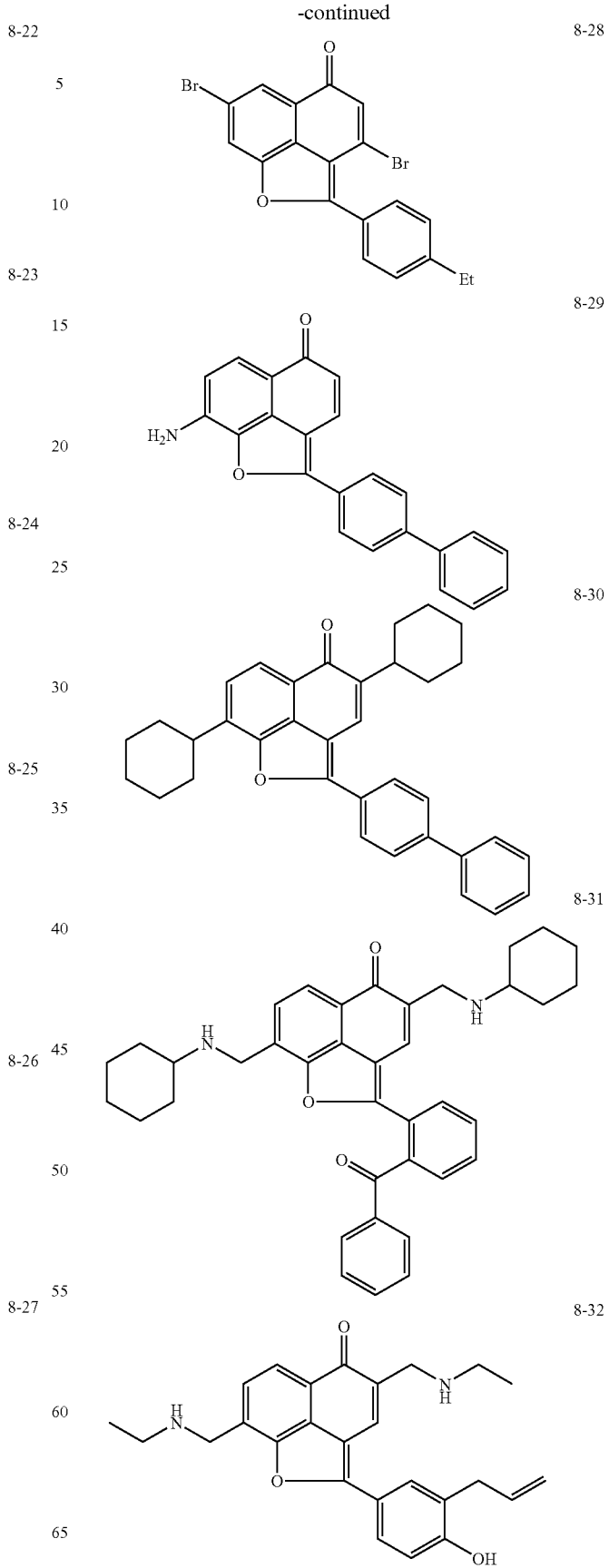
8-28
8-29
8-30
8-31
8-32

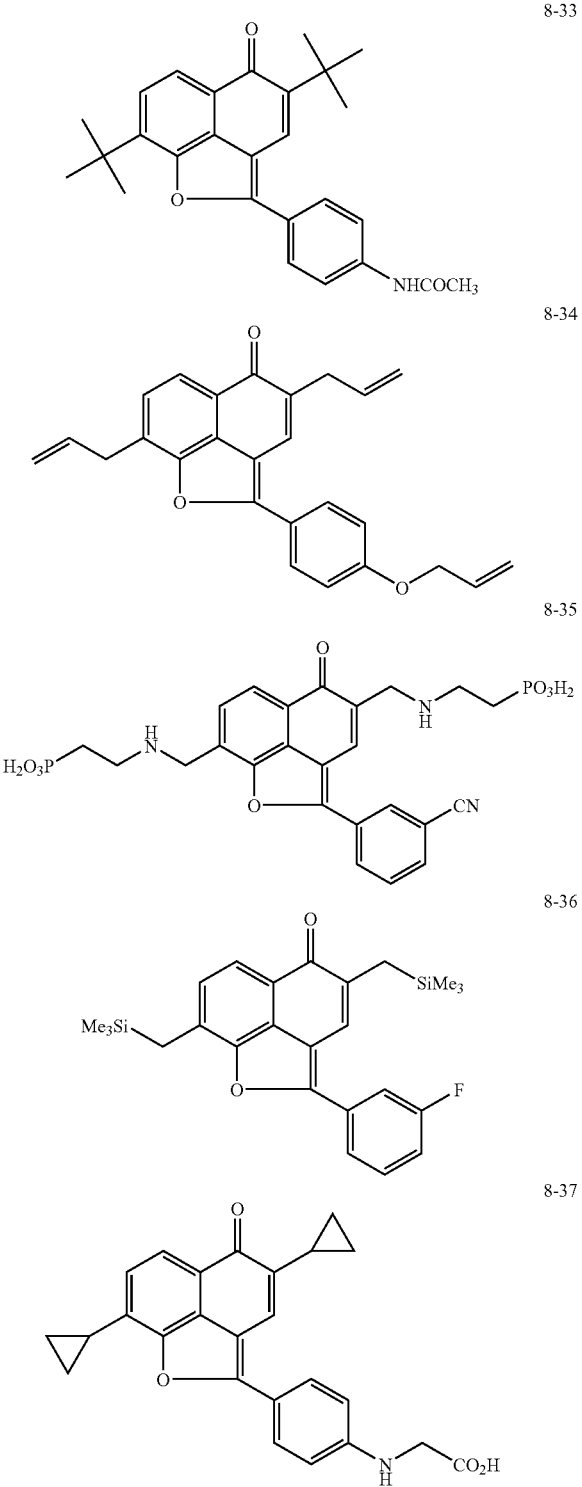

sensitive layer in the invention. Examples of the organic solvent include alcohols such as, methanol, ethanol, propanol or butanol, ketones such as acetone, methyl ethyl ketone, or cyclohexanone, aromatic hydrocarbons such as benzene, toluene, or xylene, glycols such as ethylene glycol, propylene glycol, or hexylene glycol, glycol ethers such as ethyl cellosolve, butyl cellosolve, ethyl carbitol, butyl carbitol, diethyl cellosolve, or diethyl carbitol, N-methyl pyrrolidone, and dimethylformamide. The organic solvents can be used singly or in combination of two or more kinds thereof.

The content of the sensitizing dye in the photopolymerizable light sensitive layer is not specifically limited, but is preferably from 0.1 to 10 parts by weight, and more preferably from 0.5 to 5 parts by weight, based on 100 parts of the photopolymerizable light sensitive layer.

Next, a support used in the invention will be explained.

The supports used in the planographic printing plate precursor of the invention include a plate of a metal such as aluminum, stainless steel, nickel or chromium, a plastic film such as a polyester film, a polyethylene film or a polypropylene film, which is deposited with the metal described above or laminated with film of the metal described above, and polyester film, polyvinyl chloride film or nylon film whose surface is subjected to hydrophilic treatment. An aluminum plate is preferably used for the support for the planographic printing plate precursor. In this case, the aluminum plate may be a pure aluminum plate or an aluminum alloy plate.

As the aluminum alloy, there can be used various ones including an alloy of aluminum and a metal such as silicon, copper, manganese, magnesium, chromium, zinc, lead, bismuth, nickel, titanium, sodium or iron.

It is preferable that the support in the invention is subjected to degreasing treatment for removing rolling oil prior to surface roughening (graining). The degreasing treatments include degreasing treatment employing solvents such as trichlene and thinner, and an emulsion degreasing treatment employing an emulsion such as kerosene or triethanol. It is also possible to use an aqueous alkali solution such as caustic soda for the degreasing treatment. When an aqueous alkali solution such as caustic soda is used for the degreasing treatment, it is possible to remove soils and an oxidized film which can not be removed by the above-mentioned degreasing treatment alone. When an aqueous alkali solution such as caustic soda is used for the degreasing treatment, the resulting support is preferably subjected to desmut treatment in an aqueous solution of an acid such as phosphoric acid, nitric acid, sulfuric acid, chromic acid, or a mixture thereof, since smut is produced on the surface of the support. The surface roughening methods include a mechanical surface roughening method and an electrolytic surface roughening method electrolytically etching the support surface.

Though there is no restriction for the mechanical surface roughening method, a brushing roughening method and a honing roughening method are preferable. The brushing roughening method is carried out by rubbing the surface of the support with a rotating brush with a brush hair with a diameter of 0.2 to 0.8 mm, while supplying slurry in which volcanic ash particles with a particle size of 10 to 100 μm are dispersed in water to the surface of the support. The honing roughening method is carried out by ejecting obliquely slurry with pressure applied from nozzles to the surface of the support, the slurry containing volcanic ash particles with a particle size of 10 to 100 μm dispersed in water. A surface roughening can be also carried out by laminating a support surface with a sheet on the surface of which abrading particles with a particle size of from 10 to 100 μm was coated at intervals of 100 to 200 μm and at a density of $2.5 \times 10^3$ to The sensitizing dye represented by formulae (5.) through (8.) can be synthesized according to conventional methods, for example, methods described in Japanese Patent O.P.I. Publication Nos. 2000-206690, 2001-42524, and 2001-100412.

In the invention, the sensitizing dye is dissolved in a solvent such as water or an organic solvent to obtain a dye solution, and added to a composition of the photopolymerizable light $10\times10^3/cm^2$, and applying pressure to the sheet to transfer the roughened pattern of the sheet and roughen the surface of the support.

After the support has been roughened mechanically, it is preferably dipped in an acid or an aqueous alkali solution in order to remove abrasives and aluminum dust, etc. which have been embedded in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, an aqueous alkali solution of for example, sodium hydroxide is preferably used. The dissolution amount of aluminum in the support surface is preferably 0.5 to 5 g/m². After the support has been dipped in the aqueous alkali solution, it is preferable for the support to be dipped in an acid such as phosphoric acid, nitric acid, sulfuric acid and chromic acid, or in a mixed acid thereof, for neutralization.

Though there is no restriction for the electrolytic surface roughening method, a method in which the support is electrolytically surface roughened in an acidic electrolytic solution. Though an acidic electrolytic solution generally used for the electrolytic surface roughening can be used, it is preferable to use an electrolytic solution of hydrochloric acid or that of nitric acid. The electrolytic surface roughening method disclosed in Japanese Patent Publication No. 48-28123, British Patent No. 896,563 and Japanese Patent O.P.I. Publication No. 53-67507 can be used. In the electrolytic surface roughening method, voltage applied is generally from 1 to 50 V, and preferably from 10 to 30 V. The current density used can be selected from the range from 10 to 200 A/dm², and is preferably from 50 to 150 A/dm². The quantity of electricity can be selected from the range of from 100 to 5000 C/dm², and is preferably 100 to 2000 C/dm². The temperature during the electrolytically surface roughening may be in the range of from 10 to 50° C., and is preferably from 15 to 45° C.

When the support is electrolytically surface roughened by using an electrolytic solution of nitric acid, voltage applied is generally from 1 to 50 V, and preferably from 5 to 30 V. The current density used can be selected from the range from 10 to 200 A/dm², and is preferably from 20 to 100 A/dm². The quantity of electricity can be selected from the range of from 100 to 5000 C/dm², and is preferably 100 to 2000 C/dm². The temperature during the electrolytically surface roughening may be in the range of from 10 to 50° C., and is preferably from 15 to 45° C. The nitric acid concentration in the electrolytic solution is preferably from 0.1% by weight to 5% by weight. It is possible to optionally add, to the electrolytic solution, nitrates, chlorides, amines, aldehydes, phosphoric acid, chromic acid, boric acid, acetic acid or oxalic acid.

When the support is electrolytically surface roughened by using an electrolytic solution of hydrochloric acid, voltage applied is generally from 1 to 50 V, and preferably from 2 to 30 V. The current density used can be selected from the range from 10 to 200 A/dm², and is preferably from 50 to 150 A/dm². The quantity of electricity can be selected from the range of from 100 to 5000 C/dm², and is preferably 100 to 2000 C/dm². The temperature during the electrolytically surface roughening may be in the range of from 10 to 50° C., and is preferably from 15 to 45° C. The hydrochloric acid concentration in the electrolytic solution is preferably from 0.1% by weight to 5% by weight. The electrolytic solution can contain a nitrate, a chloride, amines, aldehydes, phosphoric acid, chromic acid, boric acid, acetic acid, or oxalic acid as necessary.

After the support has been electrolytically surface roughened, it is preferably dipped in an acid or an aqueous alkali solution in order to remove aluminum dust, etc. produced in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, the aqueous alkali solution is preferably used. The dissolution amount of aluminum in the support surface is preferably 0.5 to 5 g/m². After the support has been dipped in the aqueous alkali solution, it is preferable for the support to be dipped in an acid such as phosphoric acid, nitric acid, sulfuric acid and chromic acid, or in a mixed acid thereof, for neutralization.

The mechanical surface roughening and electrolytic surface roughening may be carried out singly, and the mechanical surface roughening followed by the electrolytic surface roughening may be carried out.

After the surface roughening, anodizing treatment may be carried out. There is no restriction in particular for the method of anodizing treatment used in the invention, and known methods can be used. The anodizing treatment forms an anodization film on the surface of the support. For the anodizing treatment there is preferably used a method of applying a current density of from 1 to 10 A/dm² to an aqueous solution containing sulfuric acid and/or phosphoric acid in a concentration of from 10 to 50%, as an electrolytic solution. However, it is also possible to use a method of applying a high current density to sulfuric acid as described in U.S. Pat. No. 1,412,768, a method to electrolytically etching the support in phosphoric acid as described in U.S. Pat. No. 3,511,661, or a method of employing a solution containing two or more kinds of chromic acid, oxalic acid, malonic acid, etc. The coated amount of the formed anodization film is suitably 1 to 50 mg/dm², and preferably 10 to 40 mg/dm². The coated amount of the formed anodization film can be obtained from the weight difference between the aluminum plates before and after dissolution of the anodization film. The anodization film of the aluminum plate is dissolved employing for example, an aqueous phosphoric acid chromic acid solution which is prepared by dissolving 35 ml of 85% by weight phosphoric acid and 20 g of chromium (IV) oxide in 1 liter of water.

The support which has been subjected to anodizing treatment is optionally subjected to sealing treatment. For the sealing treatment, it is possible to use known methods using hot water, boiling water, steam, a sodium silicate solution, an aqueous dichromate solution, a nitrite solution and an ammonium acetate solution.

After the above treatment, the support is suitably undercoated with a water soluble resin such as polyvinyl phosphonic acid, a polymer or copolymer having a sulfonic acid in the side chain, or polyacrylic acid; a water soluble metal salt such as zinc borate; a yellow dye, an amine salt; and so on. The sol-gel treatment support, which has a functional group capable of causing addition reaction by radicals as a covalent bond, is suitably used.

As the support, various supports described above can be used, and a polyester film, a polyvinyl chloride film, and a nylon film whose surface is subjected to hydrophilic treatment can be also used. As a method of making the surface of such a plastic film hydrophilic, there is a sulfuric acid treatment method, a plasma etching treatment method, a corona discharge treatment method, or a water soluble resin coating method. In the invention, an aluminum plate, which is surface roughened, anodized, subjected to sealing treatment, and subcoated, is especially preferred.

The photopolymerizable light sensitive layer in the invention contains a polymer binder. As the polymer binder, the preferable is a copolymer obtained by copolymerization employing at least one of the following monomers (1) through (17) as a copolymerization monomer.

(1) A monomer having an aromatic hydroxy group, for example, o-hydroxystyrene, p-hydroxystyrene, m-hydroxystyrene, o-hydroxyphenylacrylate, p-hydroxyphenylacrylate, m-hydroxyphenylacrylate, (2) A monomer having an aliphatic hydroxy group, for example, 2-hydroxyethylacrylate, 2-hydroxyethylmethacrylate, N-methylolacrylamide, N-methylolmethacrylamide, 4-hydroxybutylacrylate, 4-hydroxybutylmethacrylate, 5-hydroxypentylacrylate, 5-hydroxypentylmethacrylate, 6-hydroxyhexylacrylate, 6-hydroxyhexylmethacrylate, N-(2-hydroxyethyl)acrylamide, N-(2-hydroxyethyl)methacrylamide, hydroxyethylvinyl ether, (3) A monomer having an aminosulfonyl group, for example, m-aminosulfonylphenyl methacrylate, p-aminosulfonylphenyl methacrylate, m-aminosulfonylphenyl acrylate, p-aminosulfonylphenyl acrylate, N-(p-aminosulfonylphenyl)methacrylamide, N-(p-aminosulfonylphenyl)acrylamide, (4) A monomer having a sulfonamido group, for example, N-(p-toluenesulfonyl)acrylamide, N-(p-toluenesulfonyl)-methacrylamide, (5) An α,β-unsaturated carboxylic acid, for example, acrylic acid, methacrylic acid, maleic acid, maleic anhydride, itaconic acid, itaconic anhydride, N-(p-toluenesulfonyl)acrylamide, N-(p-toluenesulfonyl)-methacrylamide, (6) A substituted or unsubstituted alkylacylate, for example, methylacrylate, ethylacrylate, propylacrylate, butylacrylate, amylacrylate, hexylacrylate, heptylacrylate, octylacrylate, nonylacrylate, decylacrylate, undecylacrylate, dodecylacrylate, benzylacrylate, cyclohexylacrylate, 2-chloroethylacrylate, N,N-dimethylaminoethylacrylate, glycidylacrylate, (7) A substituted or unsubstituted alkylmethacylate, for example, methylmethacrylate, ethylmethacrylate, propylmethacrylate, butylmethacrylate, amylmethacrylate, hexylmethacrylate, heptylmethacrylate, octylmethacrylate, nonylmethacrylate, decylmethacrylate, undecylmethacrylate, dodecylmethacrylate, benzylmethacrylate, cyclohexylmethacrylate, 2-chloroethylmethacrylate, N,N-dimethylaminoethylmethacrylate, glycidylmethacrylate, methacrylamide, (8) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, N-4-hydroxyphenylmethacrylamide, (9) A monomer having a fluorinated alkyl group, for example, trifluoroethylacrylate, trifluoroethylmrthacrylate, tetrafluoropropylacrylate, tetrafluoropropylmethacrylate, hexafluoropropylmethacrylate, octafluoropentylacrylate, octafluoropentylmethacrylate, heptadecafluorodecylacrylate, heptadecafluorodecylmethacrylate, N-butyl-N-(2-acryloxyethyl)heptadecafluorooctylsulfonamide,

(10) A vinyl ether, for example, ethylvinyl ether, 2-chloroethylvinyl ether, propylvinyl ether, butylvinyl ether, octylvinyl ether, phenylvinyl ether,

(11) A vinyl ester, for example, vinyl acetate, vinyl chroloacetate, vinyl butate, vinyl benzoate,

(12) A styrene, for example, styrene, methylstyrene, chloromethystyrene,

(13) A vinyl ketone, for example, methylvinyl ketone, ethylvinyl ketone, propylvinyl ketone, phenylvinyl ketone,

(14) An olefin, for example, ethylene, propylene, isobutylene, butadiene, isoprene,

(15) N-vinylpyrrolidone, N-vinylcarbazole, N-vinylpyridine,

(16) A monomer having a cyano group, for example, tacrylonitrile, metacrylonitrile, 2-pentenenitrile, 2-methyl-3-butene nitrile, 2-cyanoethylacrylate, o-cyanostyrene, m-cyanostyrene, p-cyanostyrene,

(17) A monomer having an amino group, for example, N,N-diethylaminoethylmethacrylate, N,N-dimethylaminoethylacrylate, N,N-dimethylaminoethylmethacrylate, polybutadiene urethaneacrylate, N,N-dimethylaminopropylacrylamide, N,N-dimethylacrylamide, acryloylmorpholine, N-isopropylacrylamide, N,N-diethylacrylamide, Other polymers such as a polyvinyl butyral resin, a polyurethane resin, a polyamide resin, a polyester resin, an epoxy resin, and a natural resin may be used as the polymer binder in combination with the vinyl copolymers described above.

The content of the polymer binder in the photopolymerizable light sensitive layer is preferably from 10 to 90% by weight, more preferably from 15 to 70% by weight, and still more preferably from 20 to 50% by weight in view of sensitivity. The addition amount of the vinyl copolymer is preferably from 50 to 100% by weight based on the total addition amount of the polymer binder.

The acid value of the polymer binder is preferably from 10 to 150, more preferably from 30 to 120, and still more preferably from 50 to 90, in view of balance of polarity of the light sensitive layer, which can prevent coagulation of pigment used in the light sensitive layer coating liquid.

In the invention, the light sensitive layer of the light sensitive planographic printing plate precursor of the invention can contain a known polymerization initiator.

Examples of the known photopolymerization initiator include carbonyl compounds, organic sulfur compounds, peroxides, redox compounds, azo or diazo compounds, halides and photo-reducing dyes disclosed in J. Kosar, "Light Sensitive Systems", Paragraph 5. The examples thereof are disclosed in British Patent No. 1,459,563.

Examples of the known photopolymerization initiator will be listed below, but are not limited thereto.

A benzoin derivative such as benzoin methyl ether, benzoin i-propyl ether, or α,α-dimethoxy-α-phenylacetophenone; a benzophenone derivative such as benzophenone, 2,4-dichlorobenzophenone, o-benzoyl methyl benzoate, or 4,4'-bis (dimethylamino) benzophenone; a thioxanthone derivative such as 2-chlorothioxanthone, 2-i-propylthioxanthone; an anthraquinone derivative such as 2-chloroanthraquinone or 2-methylanthraquinone; an acridone derivative such as N-methylacridone or N-butylacridone; α,α-diethoxyacetophenone; benzil; fluorenone; xanthone; an uranyl compound; a triazine derivative disclosed in Japanese Patent Publication Nos. 59-1281 and 61-9621 and Japanese Patent O.P.I. Publication No. 60-60104; an organic peroxide compound disclosed in Japanese Patent O.P.I. Publication Nos. 59-1504 and 61-243807; a diazonium compound in Japanese Patent Publication Nos. 43-23684, 44-6413, 47-1604 and U.S. Pat. No. 3,567,453; an organic azide compound disclosed in U.S. Pat. Nos. 2,848,328, 2,852,379 and 2,940,853; orthoquinondiazide compounds disclosed in Japanese Patent Publication Nos. 36-22062b, 37-13109, 38-18015 and 45-9610; various onium compounds disclosed in Japanese Patent Publication No. 55-39162, Japanese Patent O.P.I. Publication No. 59-14023 and "Macromolecules", Volume 10, p. 1307 (1977); azo compounds disclosed in Japanese Patent Publication No. 59-142205; metal arene complexes disclosed in Japanese Patent O.P.I. Publication No. 1-54440, European Patent Nos. 109,851 and 126,712, and "Journal of Imaging Science", Volume 30, p. 174 (1986); (oxo) sulfonium organoboron complexes disclosed in Japanese Patent O.P.I. Publication Nos. 5-213861 and 5-255347; titanocenes disclosed in Japanese Patent O.P.I. Publication Nos. 59-152396 and 61-151197; transition metal complexes containing a transition metal such as ruthenium disclosed in "Coordination Chemistry Review", Volume 84, p. 85-277 (1988) and Japanese Patent O.P.I. Publication No. 2-182701; 2,4,5-triarylimidazol dimmer disclosed in Japanese Patent O.P.I. Publication No. 3-209477; carbon tetrabromide; and organic halide compounds disclosed in Japanese Patent O.P.I. Publication No. 59-107344.

As the photopolymerization initiator, titanocenes can be preferably used. Examples of the titanocenes include di-cyclopentadienyl-Ti-dichloride, dicyclopentadienyl-Ti-bisphenyl, dicyclopentadienyl-Ti-bis-2,3,4,5,6-pentafluorophenyl, dicyclopentadienyl-Ti-bis-2,3,5,6-tetrafluorophenyl, dicyclopentadienyl-Ti-bis-2,4,6-trifluorophenyl, dicyclopentadienyl-Ti-bis-2,6-difluorophenyl, dicyclopentadienyl-Ti-bis-2,4-difluorophenyl, di-methylcyclopentadienyl-Ti-bis-2,3,4,5,6-pentafluorophenyl, di-methylcyclopentadienyl-Ti-bis-2,3,5,6-tetrafluorophenyl, di-methylcyclopentadienyl-Ti-bis-2,4-difluorophenyl, and bis(cyclopentadienyl)-bis(2,6-difluoro-3-(pyrryl)phenyl)titanium (IRUGACURE 784, produced by Ciba Specialty Co., Ltd.), but the invention is not limited thereto.

The coating liquid for the photopolymerizable light sensitive layer in the invention preferably contains a polymerization inhibitor in addition to the compounds described above, in order to prevent undesired polymerization of the ethylenically unsaturated bond-containing monomer during the manufacture or after storage of the light sensitive planographic printing plate. Examples of the polymerization inhibitor include hydroquinone, p-methoxyphenol, di-t-butyl-p-cresol, pyrrogallol, t-butylcatechol, benzoquinone, 4,4'-thiobis(3-methyl-6-t-butylphenol), 2,2'-methylenebis(4-methyl-6-t-butylphenol), N-nitrosophenylhydroxylamine cerous salt, and 2-t-butyl-6-(3-t-butyl-6-hydroxy-5-mrthyl-benzyl)-4-methylphenyl acrylate.

The polymerization inhibitor content is preferably 0.01 to 5% by weight based on the total solid content of the photopolymerizable light sensitive layer composition. Further, in order to prevent polymerization induced by oxygen, a higher fatty acid such as behenic acid or a higher fatty acid derivative such as behenic amide may be added to the layer, or may be localized on the surface of the layer in the drying step after coating. The higher fatty acid or higher fatty acid derivative content is preferably 0.5 to 10% by weight based on the total solid content of the photopolymerizable light sensitive layer composition.

A colorant can be also used. As the colorant can be used known materials including commercially available materials. Examples of the colorant include those described in revised edition "Ganryo Binran", edited by Nippon Ganryo Gijutu Kyoukai (publishe by Seibunndou Sinkosha), or "Color Index Binran".

Kinds of the pigment include black pigment, yellow pigment, red pigment, brown pigment, violet pigment, blue pigment, green pigment, fluorescent pigment, and metal powder pigment. Examples of the pigment include inorganic pigment (such as titanium dioxide, carbon black, graphite, zinc oxide, Prussian blue, cadmium sulfide, iron oxide, or chromate of lead, zinc, barium or calcium); and organic pigment (such as azo pigment, thioindigo pigment, anthraquinone pigment, anthanthrone pigment, triphenedioxazine pigment, vat dye pigment, phthalocyanine pigment or its derivative, or quinacridone pigment).

Among these pigment, pigment is preferably used which does not substantially have absorption in the absorption wavelength regions of a spectral sensitizing dye used according to a laser for exposure. The absorption of the pigment used is not more than 0.05, obtained from the reflection spectrum of the pigment measured employing an integrating sphere and employing light with the wavelength of the laser used. The pigment content is preferably 0.1 to 10% by weight, and more preferably 0.2 to 5% by weight, based on the total solid content of the photopolymerizable light sensitive layer composition.

When an argon laser (488 nm) or an SHG-YAG laser (532 nm) is used as a light source for exposure, violet pigment or blue pigment is preferably used in view of the above absorption wavelength relationship or image visibility after the exposure. Such pigment examples include Cobalt Blue, cerulean blue, alkali blue lake, Victria Blue lake, metal free phthalocyanine, Phthalocyanine Blue, Fast Sky Blue, Indanthrene Blue, indigo, dioxane violet, isoviolanthrone violet, Indanthrone Blue, and Indanthrene BC. Among these, Phthalocyanine Blue and dioxane violet are preferred.

The above composition can contain a surfactant as a coatability improving agent, as long as performance of the invention is not jeopardized. The surfactant is preferably a fluorine-contained surfactant.

Further, in order to improve a physical property of the photopolymerizable light sensitive layer, the layer can contain an inorganic filler or a plasticizer such as dioctyl phthalate, dimethyl phthalate or tricresyl phosphate. The content of such a material is preferably not more than 10% by weight, based on the total solid content of the light sensitive layer composition.

The photopolymerizable light sensitive layer in the invention has a thickness of preferably 0.1 to 5 $g/m^2$, and more preferably 0.5 to 2.5 $g/m^2$.

(Coating)

The solvents used in the preparation of a coating liquid for the photopolymerizable light sensitive layer in the invention include an alcohol such as sec-butanol, isobutanol, n-hexanol, or benzyl alcohol; a polyhydric alcohol such as diethylene glycol, triethylene glycol, tetraethylene glycol, or 1,5-pentanediol; an ether such as propylene glycol monobutyl ether, dipropylene glycol monomethyl ether, or tripropylene glycol monomethyl ether; a ketone or aldehyde such as diacetone alcohol, cyclohexanone, or methyl cyclohexanone; and an ester such as ethyl lactate, butyl lactate, diethyl oxalate, or methyl benzoate.

The prepared coating liquid for the photopolymerizable light sensitive layer is coated on a support according to a conventional method, and dried to obtain a light sensitive planographic printing plate precursor. Examples of the coating method include an air doctor coating method, a blade coating method, a wire bar coating method, a knife coating method, a dip coating method, a reverse roll coating method, a gravure coating method, a cast coating method, a curtain coating method, and an extrusion coating method.

A low drying temperature of the coated light sensitive layer cannot provide sufficient printing durability, while too a high drying temperature of the coated light sensitive layer results in marangoni and produces fog at non-image portions. The drying temperature is preferably from 60 to 160° C., more preferably from 80 to 140° C., and still more preferably from 90 to 120° C.

<<Color Layer>>

The color layer in the invention will be explained below. The light sensitive planographic printing plate precursor of the invention can be handled in a yellow lamp room which is lighter.

However, the yellow lamp used emits light having a wavelength of up to approximately 470 nm. The light sensitive planographic printing plate precursor may be sensitive to such a light, resulting in fog occurrence. In order to prevent such fog, a color layer is preferably provided on the photopolymerizable light sensitive layer in contact with the photopolymerizable light sensitive layer or through another layer.

In order to improve thermal stability and a safe light property as well as sensitivity, the color layer has an optical density at wavelength regions of from 410 to 800 nm of preferably from 0.2 to 3.0, more preferably from 0.4 to 2.0, and still more preferably from 0.5 to 1.5.

(Adjustment and Measurement of Color Layer)

A first sample is prepared by coating a color layer containing a colorant on a 100 μm thick transparent polyethylene terephthalate film. Similarly, a second sample is prepared by coating a layer containing no colorant on a 100 μm thick transparent polyethylene terephthalate film. The optical density of both samples was measured employing a spectrophotometer U-3300 (produced by Hitachi Co., Ltd.). In the invention, the difference between the optical densities of the first and second samples is defined as the optical density of the colorant layer.

(Colorant Content in the Color Layer)

The colorant content in the color layer is preferably from 5 to 500 mg/m$^2$, and more preferably from 10 to 100 mg/m$^2$.

(Colorant)

The colorant used in the color layer is a dye or pigment. The following water soluble dyes are preferably used.

As the water soluble dye, there is a cationic dye, a reactive dye, an acid dye, or a direct dye. Typical examples of the dye include a nitroso dye such as Naphthol Green B, a nitro dye such as Naphthol Yellow S or Polar Yellow Brown, an azo dye such as Diachron Scarlet RN, Diamira Red B, Diamira Brilliant Red BB, Diamira Brilliant Violet 5R, Diamira Brilliant Red GG, Diamira Brilliant Orange FR, Diamira Brilliant Orange 3R, Diacryl Brilliant Red GTL-N, Diacryl Red GL-N, Diacryl Brilliant Red GRL-N, Victoria Scarlet 3R, Sulfone Acid Blue R, Supramine red GG, Supramine red B, Supramine Blue R, Polar Red G, Polar Orange R, Metachrome Red 5G, Metachrome Brilliant Blue BL, Supranol Orange RR or Supranol Brilliant Red; a thiazole dye such as Diacryl Red CS-N, Thizine Red R, Thioflavin T, a diphenylmethane dye such as Auramine, a triphenylmethane dye such as Victoria Pure Blue BOH, Crystal Violet, Methyl Violet, Ethyl Violet, Spirit Blue, Acid Violet 6B or Malachite Green, a xanthene dye such as Pyronine G, Rhodamine S, Eosin G, Eosin Y, Erythrosine, Rose Bengal B, Rhodamine B or Rhodamine 3GO; an acridine dye such as Acridine Orange or 2GNX; an azine dye such as Neutral Violet, Neutral Red, Azocarmine, Safranine T, Wool Fast Blue BL, or Indocyanine B; an oxazine dye such as Gallocyanine; a dioxazine dye such as Sirius Light Blue FFRL or Sirius Light Blue F3GL; a thiazine dye such as Methylene Blue or Methylene Green G; an anthtaquinone dye such as Diacid Light Blue BR, Alizarin Direct Violet EFF, Supracen Violet 4BF, Alizarin Sky Blue B, Alizarin Cyanine Green G, Carbolane Green G, Alizarin Cyanine Green 5G, Alizarin Brilliant Pure Blue R, Brilliant Alizarin Light Red 4B, or Alizarin Uranol 2B; a phthalocyanine dye such as Heliogen Blue SBP or Tolazole Fast Blue 8GS; a cyanine dye such as Diacryl Brilliant Red 3GN, Diacryl Brilliant Pink GN, Diacryl Brilliant Pink RN, or Diacryl Brilliant Red 6BN; and a quinoline dye such as quinoline yellow or Supra Light Yellow GGL.

As pigment in the color layer is, pigment as described above can be used.

Among these pigment, pigment is preferably used which does not substantially have absorption in the absorption wavelength regions of a spectral sensitizing dye used according to a laser for exposure. The absorption of the pigment used is not more than 0.05, obtained from the reflection spectrum of the pigment measured employing an integrating sphere and employing light with the wavelength of the laser used. The pigment content is preferably 0.1 to 10% by weight, and more preferably 0.2 to 5% by weight, based on the total solid content of the photopolymerizable light sensitive layer composition.

When an argon laser (488 nm) or an SHG-YAG laser (532 nm) is used as a light source for exposure, violet pigment or blue pigment is preferably used in view of the above absorption wavelength relationship or image visibility after the exposure. Such pigment examples include Cobalt Blue, cerulean blue, alkali blue lake, Victria Blue lake, metal free phthalocyanine, Phthalocyanine Blue, Fast Sky Blue, Indanthrene Blue, indigo, dioxane violet, isoviolanthrone violet, Indanthrone Blue, and Indanthrene BC. Among these, Phthalocyanine Blue and dioxane violet are preferred.

The above composition can contain a surfactant as a coatability improving agent, as long as performance of the invention is not jeopardized. The surfactant is preferably a fluorine-contained surfactant.

Further, in order to improve a physical property of the color layer, the layer can contain an inorganic filler or a plasticizer such as dioctyl phthalate, dimethyl phthalate or tricresyl phosphate. The content of such a material is preferably not more than 10% by weight, based on the total solid content of the light sensitive layer composition.

<<Overcoat Layer>>

In the light sensitive planographic printing plate precursor, an overcoat layer containing polyvinyl alcohol is preferably provided on the photopolymerizable light sensitive layer in contact with the photopolymerizable light sensitive layer or through another layer. It is more preferred in the light sensitive planographic printing plate that a color layer having an optical density at wavelength regions of from 410 to 800 nm of preferably from 0.2 to 3.0 is provided on the overcoat layer in contact with the overcoat layer or through another layer.

Such a light sensitive planographic printing plate precursor is preferred in improving a safe light property and sensitivity.

The overcoat layer contains polyvinyl alcohol, and the polyvinyl alcohol content of the overcoat layer is preferably not less than 5% by weight, more preferably not less than 50% by weight, and still more preferably not less than 80% by weight. The overcoat layer may contain the colorant described above.

<<Protective Layer>>

A protective layer is preferably provided on the photopolymerizable light sensitive layer of the light sensitive planographic printing plate precursor of the invention. It is preferred that the protective layer (oxygen shielding layer) is highly soluble in a developer (generally an alkaline solution) described later.

Examples of materials used in the protective layer include polyvinyl alcohol, polysaccharide, polyvinyl pyrrolidone, polyethylene glycol, gelatin, glue, casein, hydroxyethyl cellulose, carboxymethyl cellulose, methylcellulose, hydroxyethyl starch, gum arabic, sucrose octacetate, ammonium alginate, sodium alginate, polyvinyl amine, polyethylene oxide, polystyrene sulfonic acid, polyacrylic acid, and a water soluble polyamide. These materials may be used singly or as a mixture of two or more thereof. The especially preferred is polyvinyl alcohol.

A coating liquid for the protective layer can be prepared by dissolving the materials described above in an appropriate solvent. The thus prepared coating liquid is coated on the photopolymerizable layer and dried to form a protective layer. The thickness of the protective layer is preferably from 0.1 to 5.0 μm, and more preferably from 0.5 to 3.0 μm. The protective layer further contains a surfactant or matting agent as necessary.

The protective layer coating liquid can be suitably coated on the photopolymerizable layer employing the known coating method described above. A drying temperature of the protective layer coated on the photopolymerizable layer is preferably lower than, more preferably not less than 10° C. lower than, and still more preferably not less than 20° C. lower than, that of the photopolymerizable layer. In the above, difference between the drying temperatures of the protective layer and the photopolymerizable layer is not more than 50° C.

The drying temperature of the protective layer coated on the photopolymerizable layer is preferably lower than the, glass transition temperature (Tg) of the polymer binder contained in the light sensitive polymerizable layer. The difference between the drying temperature of the protective layer and the glass transition temperature (Tg) of the polymer binder is preferably not less than 20° C., and more preferably not less than 40° C. In the above, the difference is not more than 60° C.

A method of forming an image on the light sensitive planographic printing plate precursor of the invention comprises imagewise exposing the light sensitive planographic printing plate precursor described above, and developing the exposed plate with a developer described later.

The light sources for forming an image on the light sensitive planographic printing plate precursor of the invention include, for example, a laser, an emission diode, a xenon flush lamp, a halogen lamp, a carbon arc light, a metal halide lamp, a tungsten lamp, a high pressure mercury lamp, and a non-electrode light source.

When the light sensitive planographic printing plate precursor is imagewise exposed at one time, a mask material having a negative image pattern made of a light shielding material is put on the plate to be in close contact with the plate, and exposure is carried out through the mask.

When an array light such as an emission diode array is used or exposure using a halogen lamp, a metal halide lamp or a tungsten lamp is controlled using an optical shutter material such as liquid crystal or PLZT, a digital exposure according to an image signal is possible and preferable. In this case, direct writing is possible without using any mask material.

When a laser is used for exposure, which can be condensed in the beam form, scanning exposure according to an image can be carried out, and direct writing is possible without using any mask material. When the laser is employed for imagewise exposure, a highly dissolved image can be obtained, since it is easy to condense its exposure spot in minute size.

As the laser, argon laser, He—Ne gas laser, YAG laser or semi-conductor laser is preferably used.

A laser scanning method by means of a laser beam includes a method of scanning on an outer surface of a cylinder, a method of scanning on an inner surface of a cylinder and a method of scanning on a plane. In the method of scanning on an outer surface of a cylinder, laser beam exposure is conducted while a drum around which a recording material is wound is rotated, in which main scanning is represented by the rotation of the drum, while sub-scanning is represented by the movement of the laser beam. In the method of scanning on an inner surface of a cylinder, a recording material is fixed on the inner surface of a drum, a laser beam is emitted from the inside, and main scanning is carried out in the circumferential direction by rotating a part of or an entire part of an optical system, while sub-scanning is carried out in the axial direction by moving straight a part of or an entire part of the optical system in parallel with a shaft of the drum. In the method of scanning on a plane, main scanning by means of a laser beam is carried out through a combination of a polygon mirror, a galvano mirror and an Fθ lens, and sub-scanning is carried out by moving a recording medium. The method of scanning on an outer surface of a cylinder and the method of scanning on an inner surface of a cylinder are more suitable for high density recording because they make it easy to enhance a precision of an optical system.

The light sensitive planographic printing plate precursor used in the invention is subjected to imagewise exposure to harden the exposed portions of the photopolymerizable light sensitive layer, and subjected to developing treatment employing an alkaline developer to remove unexposed portions of the layer, whereby an image is formed. As the developer, a conventional alkali developer can be used. Examples of the developer include an alkali developer containing inorganic alkali agents such as sodium silicate, potassium silicate, ammonium silicate, sodium secondary phosphate, potassium secondary phosphate, ammonium secondary phosphate, sodium bicarbonate, potassium bicarbonate, ammonium bicarbonate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, potassium hydroxide, ammonium hydroxide, and lithium hydroxide.

The developer may contain organic alkali agents such as monomethylamine, dimethylamine, trimethylamine, monoethylamine, diethylamine, triethylamine, monoisopropylamine, diisopropylamine, butylamine, monoethanolamine, diethanolamine, triethanolamine, monoisopropanolamine, diisopropanolamine, ethyleneimine, ethylenediamine, and pyridine.

These alkali agents can be used singly or in combination of two or more kinds thereof. The developer may optionally contain a surfactant such as an anionic surfactant, an amphoteric surfactant or alcohol.

The developer used in the invention is preferably a developer containing alkali metal silicate and having a pH of preferably less than 12.5, and more preferably from 10.5 to 12.4. Development of such a developer provides the excellent results in the invention that not only developability and sensitivity but also sludge restraining property and printing durability are improved.

A developer preferably contains a surfactant with a hydrophobic group having no alkyl group or a surfactant with a hydrophobic group including an alkyl group in which the molecular weight of the alkyl group is not more than 25% of the total molecular weight of the hydrophobic group. The content of the surfactant in the developer is preferably from 4.0 to 10.0% by weight, and more preferably from 4.5 to 7.0% by weight. The alkyl group content of the hydrophobic group in the surfactant is preferably 0 to 5% by weight. The molecular weight of the hydrophobic group is preferably at least 120. The developer containing such a surfactant in the amount as described above minimizes sludge produced during processing, restrains foams produced during processing, and further minimizes undesired thickness reduction of the light sensitive layer.

Examples of the surfactant will be listed below.

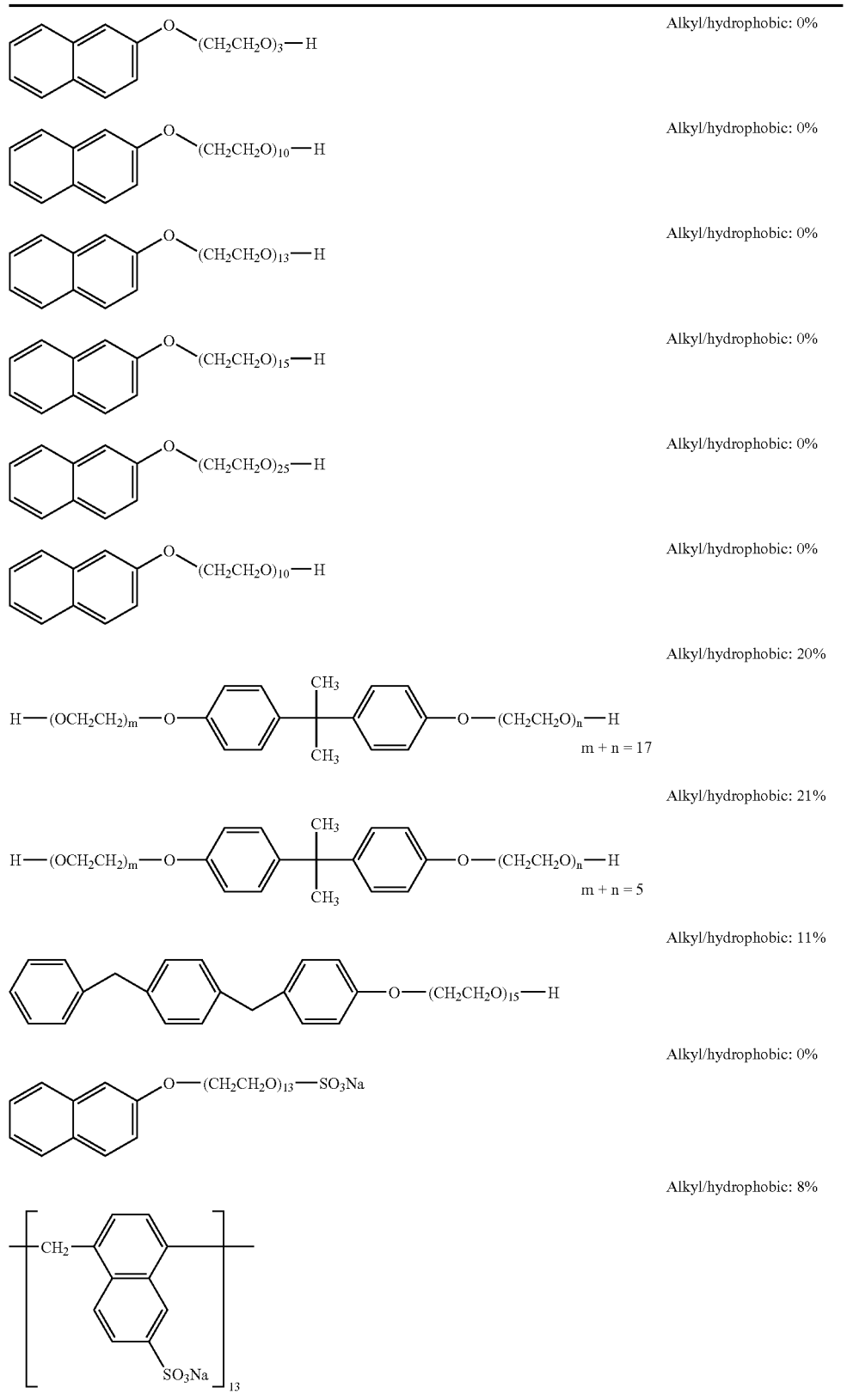

In the above, "Alkyl/hydrophobic" represents the alkyl group content (% by molecular weight) of the hydrophobic group in the surfactant.

EXAMPLES

Next, the present invention will be shown below employing examples, but the present invention is not limited thereto. In the examples, "parts" represents "parts by weight", unless otherwise specified.

(Synthesis of Polymer Binder)

Twelve parts of methacrylic acid, 70 parts of methyl methacrylate, 8 parts of acrylonitrile, 10 parts of ethyl methacrylate, 500 parts of ethanol, and 3 parts of α,α'-azobisisobutylonitrile were put in a three neck flask under nitrogen atmosphere, and reacted under nitrogen atmosphere for 6 hours at 80° C. in an oil bath. After that, 3 parts of triethylammonium chloride and 2 parts of glycidyl methacrylate were further added to the mixture, and reacted for additional 3 hours. Thus, acryl copolymer 1 was obtained. The weight average molecular weight of the acryl copolymer 1 was 50,000, measured according to GPC. The glass transition temperature Tg of the acryl copolymer 1 was 85° C., measured according to DSC (differential thermal analysis).

(Preparation of Support)

A 0.24 mm thick aluminum plate (material 1050, quality H16) was degreased at 60° C. for one minute in a 5% sodium hydroxide solution, washed with water, immersed at 25° C. for one minute in a 10% hydrochloric acid solution to neutralize, and then washed with water. The resulting aluminum plate was electrolytically etched using an alternating current at 25° C. for 60 seconds at a current density of 100 A/dm$^2$ in a 0.3 weight % nitric acid solution, and desmutted at 60° C. for 10 seconds in a 5% sodium hydroxide solution. The desmutted aluminum plate was anodized at 25° C. for 1 minute at a current density of 10 A/dm$^2$ and at a voltage of 15 V in a 15% sulfuric acid solution.

The center line average surface roughness (Ra) of the resulting support was 0.65 μm. The support was further subjected to hydrophilic treatment at 80° C. for 30 minutes, employing a 1.5% polyvinyl phosphonic acid aqueous solution and a 0.2% vinyl phosphoric acid aqueous solution.

(Preparation of Subbed Support)

The following subbing layer coating liquid was coated on the support obtained above using a wire bar, dried at 90° C. for one minute, and further heated at 110° C. for 3 minutes to give a subbing layer with a dry thickness of 0.1 g/m$^2$. Thus, a subbed support was obtained.

<Subbing Layer Coating Liquid>

| | |
|---|---|
| γ-Methacryloxypropyltrimethoxysilane | 1 part |
| Methyl ethyl ketone | 80 parts |
| Cyclohexanone | 19 parts |

(Preparation of Light Sensitive Planographic Printing Plate Precursor Sample)

The following photopolymerizable light sensitive layer coating liquid was coated on the subbed support using a wire bar, and dried at 95° C. for 1.5 minutes to give a light sensitive layer with a dry thickness of 1.4 g/m$^2$. After that, the following overcoat layer coating liquid was coated on the light sensitive layer using an applicator, and dried at 75° C. for 1.5 minutes to give an overcoat layer with a dry thickness of 2.0 g/m$^2$. Thus, light sensitive planographic printing plate precursor samples as shown in Table 1 were prepared.

(Photopolymerizable Light Sensitive Layer Coating Liquid)

| | |
|---|---|
| Polymer binder (Acryl copolymer 1) | 35.0 parts |
| Sensitizing dye (as shown in Table 1) | 4.0 parts |
| Compounds of formula (3) or comparative initiator 1 (as shown in Table 1) | 4.0 parts |
| Compounds of formula (1) or (2), or comparative compound 1 (as shown in Table 1) | 50.0 parts |
| Phthalocyanine pigment (MHI #454 produced by Mikuni Sikisosha) | 4.5 parts |
| 2-t-Butyl-6-(3-t-butyl-2-hydroxy-5-methylbenzyl)-4-methylphenyl acrylate (Sumirizer GS produced by Sumitomo 3M Co., Ltd.) | 0.5 parts |
| Sanol LS-770 (produced by Sankyo Co., Ltd.) | 0.5 parts |
| Fluorine-contained surfactant (Megafac F-178K produced by Sumitomo 3M Co., Ltd.) | 0.5 parts |
| Triazine compound described below | 1.0 part |
| Methyl ethyl ketone | 80 parts |
| Cyclohexanone | 820 parts |
| (Overcoat layer coating liquid) | |
| Polyvinyl alcohol (GL-05, produced by Nippon Gosei Kagaku Co., Ltd.) | 89 parts |
| Water soluble polyamide (P-70, produced by Toray Co., Ltd.) | 10 parts |
| Surfactant (Surfinol 465, produced by Nisshin Kagaku Kogyo Co., Ltd.) | 1.0 parts |
| Water | 900 parts |

Triazine compound

<<Evaluation of Light Sensitive Planographic Printing Plate Precursor Sample>>

The light sensitive planographic printing plate precursor sample obtained above was imagewise exposed at a resolving degree of 2540 dpi, employing an exposure apparatus Tigercat (produced by ECRM Co., Ltd.) equipped with an FD-YAG laser (532 nm) light source. Herein, dpi represents a dot number per 2.54 cm. Subsequently, the exposed sample was pre-heated, pre-washed, subjected to development treatment, post-washed, and gumming treated, employing a CTP automatic developing machine (PHW 23-V produced by Technigraph Co., Ltd.) to obtain a planographic printing plate. Herein, the developing machine comprised a preheating section, a pre-washing section for removing the over coat layer before development, a development section charged with a developer as described below, a post-washing section for removing the developer remaining on the developed sample after development, and a gumming section charged with a gumming solution (a solution obtained by diluting GW-3, produced by Mitsubishi Chemical Co., Ltd., with water by a factor of 2) for protecting the surface of the developed sample. Thus, a planographic printing plate was obtained.

Developer (Aqueous Solution Containing the Following Materials)

| | |
|---|---|
| Potassium silicate A (an aqueous potassium silicate solution containing 26.5% by weight of SiO$_2$ and 13.5% by weight of K$_2$O) | 8.0% by weight |
| Surfactant as shown in Table 1 | 3.0% by weight |
| Potassium hydroxide | Amount giving pH 12.3 |

(Evaluation of Light Sensitive Planographic Printing Plate Precursor Samples)

The light sensitive planographic printing plate precursor samples obtained above were evaluated as follows:

The results are shown in Table 1.

<<Sensitivity>>

Sensitivity was represented in terms of minimum exposure amount through which a planographic printing plate was obtained in which an image of a 175 screen line number/inch with a dot area of 50% was reproduced and no reduction of the layer thickness at image portions was observed.

<<Printing Durability>>

The light sensitive planographic printing plate precursor samples were exposed at an appropriate exposure amount and developed to obtain planographic printing plate samples. Herein, the appropriate exposure amount was two times the exposure amount whereby a planographic printing plate was obtained in which an image of a 175 screen line number/inch with a dot area of 50% was reproduced and no reduction of the layer thickness at image portions was observed. The resulting planographic printing plate samples were mounted on a printing press, DAIYA 1F-1 produced by Mitsubishi Jukogyo Co., Ltd., and printing was carried out employing a coated paper, printing ink (Toyo King Hyecho M Magenta, produced by Toyo Ink Manufacturing Co.), and dampening water SG-51 (concentration: 1.5%, produced by Tokyo Ink Co., Ltd.). Every time one thousand printed papers were obtained, the printing was suspended, and the planographic printing plate samples on the press were wiped with a plate cleaner. After that, the wiped samples were observed, and printing was finished when dot reduction at the highlight portions and clogging at shadow portions of the wiped samples were observed. The number of the wiping operation was used for a measure of printing durability. For example, printing durability 1 shows that printing was carried out up to one thousand copies. The greater number shows higher printing durability.

<<Stain Elimination Property>>

After printing was carried out to one thousand copies, and suspended, the resulting printing plate samples was wiped with a plate cleaner, and allowed to stand for 15 minutes. After that, printing was resumed. The number of printed papers, in which stain at the background disappeared after resumption of printing, was used for stain elimination property. The greater number is preferred.

<<Reproduction of 90% Dot>>

The light sensitive planographic printing plate precursor was exposed employing the exposure amount described above without correction of linearity. The dot image, which was to be reproduced to a 90% dot area, was photographed at a magnification of 500, and dot area in the dot image with a size of 2 mm×2 mm in the photograph was determined and used for a measure of reproduction of 90% dot.

<<Sludge>>

Each sample of a size of 1.5 m$^2$ was immersed at 28° C. for 30 seconds in 100 ml of the developer described above. The resulting developer was filtered with a filter and the residue was washed with water and dried at 70° C. for one day. The weight of the dried residue as used for a measure of sludge.

The results are shown in Table 1.

TABLE 1

| Compound of formula (1) or (2) | Compound of formula (3) | Sensitizing dye | Surfactant | Sensitivity (μJ/cm$^2$) | Printing durability (number) | Stain elimination property (number) | *1 | Sludge (g) | Remarks |
|---|---|---|---|---|---|---|---|---|---|
| CC. 1 | CI. 1 | *1 | a | 250 | 30 | 30 | 98 | 0.8 | Comp. |
| 1-1 | CI. 1 | *1 | a | 230 | 33 | 30 | 97 | 0.8 | Comp. |
| CC. 1 | 37 | d-1 | a | 250 | 29 | 32 | 98 | 0.8 | Comp. |
| 1-1 | 37 | d-1 | a | 200 | 45 | 22 | 96 | 0.6 | Inv. |
| 1-1 | 37 | d-2 | a | 200 | 45 | 20 | 96 | 0.6 | Inv. |
| 1-1 | 37 | d-3 | a | 190 | 47 | 21 | 96 | 0.6 | Inv. |
| 1-1 | 38 | d-1 | a | 200 | 45 | 23 | 96 | 0.6 | Inv. |
| 1-1 | 39 | d-1 | a | 190 | 47 | 22 | 96 | 0.6 | Inv. |
| 1-2 | 37 | d-1 | a | 190 | 46 | 22 | 96 | 0.6 | Inv. |
| 1-3 | 37 | d-1 | a | 190 | 47 | 20 | 96 | 0.6 | Inv. |
| 2-1 | 37 | d-1 | a | 200 | 46 | 21 | 96 | 0.6 | Inv. |
| 2-2 | 37 | d-1 | a | 190 | 47 | 20 | 96 | 0.6 | Inv. |
| 2-3 | 37 | d-1 | a | 190 | 47 | 22 | 96 | 0.6 | Inv. |
| 1-1 | 37 | d-1 | 1 | 180 | 50 | 21 | 95 | 0.3 | Inv. |
| 1-2 | 37 | d-1 | 1 | 180 | 50 | 22 | 95 | 0.3 | Inv. |
| 1-3 | 37 | d-1 | 1 | 180 | 50 | 20 | 95 | 0.3 | Inv. |
| 1-1 | 37 | d-1 | 2 | 180 | 48 | 22 | 95 | 0.3 | Inv. |
| 1-1 | 37 | d-1 | 3 | 180 | 48 | 22 | 95 | 0.3 | Inv. |
| 10-2 | 37 | d-1 | a | 170 | 50 | 20 | 95 | 0.3 | Inv. |
| 10-3 | 37 | d-1 | a | 170 | 50 | 20 | 95 | 0.2 | Inv. |

*1; Reproduction of 90% dot (%)
Comp: Comparative, Inv: Inventive,
CC. 1: Comparative compound 1, CI. 1: Comparative initiator 1,
*1: Sensitizing dye 1
Comparative compound 1

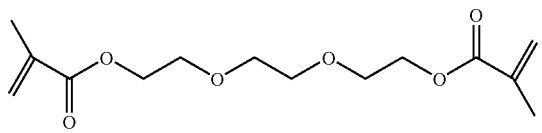

TABLE 1-continued
Comparative initiator 1
IRUGACURE 784 (produced by Ciba Special Co. Ltd.)
Surfactant 1
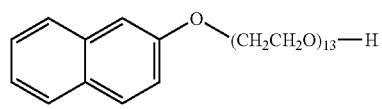
Surfactant 2
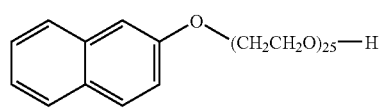
Surfactant 3
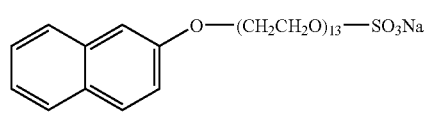
Surfactant a
Sodium butylnaphthalene sulfonate (Alkyl group content
of the hydrophobic group is 30% by molecular weight)
Sensitizing dye 1
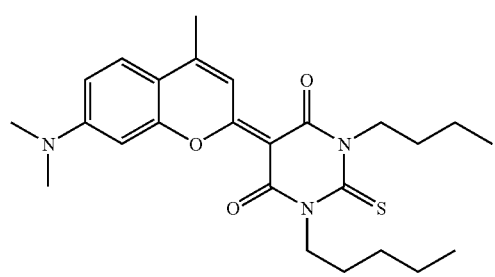
λmax: 520 nm
d-1
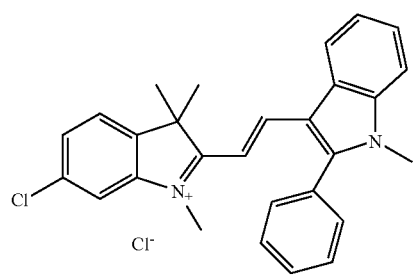
λmax: 510 nm
d-2
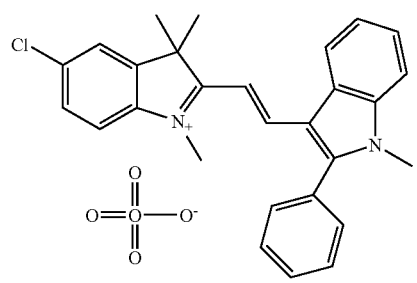
λmax: 500 nm TABLE 1-continued d-3

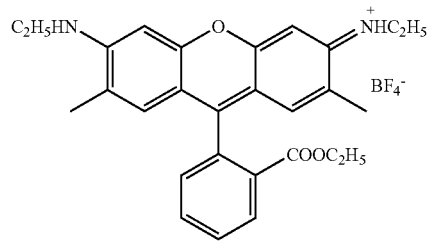

λmax: 520 nm

As is apparent from Table 1 above, the inventive samples provide excellent sensitivity, excellent printing durability, excellent stain elimination property, excellent dot reproduction, and excellent sludge restraining property.

Example 2

The light sensitive planographic printing plate precursor samples were prepared in the same manner as in Example 1, except that compounds of formula (4) as shown in Table 2 were used instead of compounds of formula (3), and sensitizing dyes used were changed to those as shown in Table 2. The resulting samples were evaluated in the same manner as in Example 1. The results are shown in Table 1.

In Table 2, Surfactant b, Compounds 4-1, 4-2, and 4-3 are as follows:

Surfactant b: Polyoxyethylene (25) lauryl ether (The alkyl group content in the hydrophobic group is 100% by weight.)

Compound 4-1: (η6-benzene)(η5-cyclopentadienyl)iron(2) hexafluorophosphate

Compound 4-2: (η6-toluene)(η5-cyclopentadienyl)iron(2) hexafluorophosphate

Compound 4-3: (η6-naphthalene)(η5-cyclopentadienyl)iron(2) hexafluorophosphate

TABLE 2

| Compound of formula (1) or (2) | Compound of formula (4) | Sensitizing dye | Surfactant | Sensitivity (μJ/cm2) | Printing durability (number) | Stain elimination property (number) | *1 | Sludge (g) | Remarks |
|---|---|---|---|---|---|---|---|---|---|
| CC. 1 | CI. 1 | *1 | b | 260 | 31 | 31 | 98 | 0.9 | Comp. |
| 1-1 | CI. 1 | *1 | b | 250 | 34 | 31 | 98 | 0.8 | Comp. |
| CC. 1 | 4-1 | e-1 | b | 240 | 30 | 33 | 98 | 0.9 | Comp. |
| 1-1 | 4-1 | e-1 | b | 190 | 48 | 20 | 96 | 0.6 | Inv. |
| 1-1 | 4-1 | e-2 | b | 180 | 48 | 18 | 96 | 0.6 | Inv. |
| 1-1 | 4-1 | e-3 | b | 180 | 50 | 20 | 96 | 0.6 | Inv. |
| 1-1 | 4-2 | e-1 | b | 190 | 50 | 22 | 95 | 0.6 | Inv. |
| 1-1 | 4-3 | e-1 | b | 180 | 51 | 20 | 96 | 0.6 | Inv. |
| 1-2 | 4-1 | e-1 | b | 170 | 48 | 20 | 96 | 0.5 | Inv. |
| 1-3 | 4-1 | e-1 | b | 180 | 49 | 18 | 95 | 0.6 | Inv. |
| 2-1 | 4-1 | e-1 | b | 190 | 50 | 19 | 96 | 0.6 | Inv. |
| 2-2 | 4-1 | e-1 | b | 180 | 49 | 19 | 96 | 0.5 | Inv. |
| 2-3 | 4-1 | e-1 | b | 170 | 48 | 21 | 95 | 0.6 | Inv. |
| 1-1 | 4-1 | e-1 | 1 | 160 | 52 | 20 | 95 | 0.3 | Inv. |
| 1-2 | 4-1 | e-1 | 1 | 170 | 52 | 20 | 95 | 0.3 | Inv. |
| 1-3 | 4-1 | e-1 | 1 | 170 | 53 | 18 | 95 | 0.3 | Inv. |
| 1-1 | 4-1 | e-1 | 2 | 170 | 52 | 20 | 95 | 0.3 | Inv. |
| 1-1 | 4-1 | e-1 | 3 | 180 | 52 | 20 | 95 | 0.3 | Inv. |
| 10-12 | 4-1 | e-1 | b | 170 | 54 | 18 | 95 | 0.2 | Inv. |
| 10-13 | 4-1 | e-1 | b | 170 | 55 | 18 | 95 | 0.2 | Inv. |

*1; Reproduction of 90% dot (%)

Comp: Comparative, Inv: Inventive,

CC. 1: Comparative compound 1, CI. 1: Comparative initiator 1, *1: Sensitizing dye 1 e-1

TABLE 2-continued

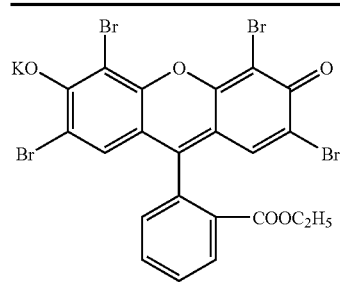

λmax: 520 nm e-2

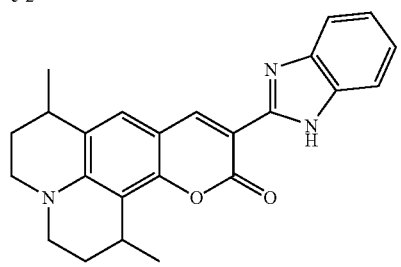

λmax: 500 nm e-3

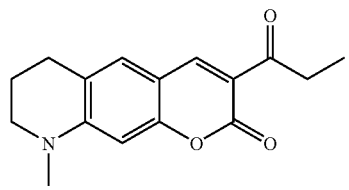

λmax: 495 nm

As is apparent from Table 2 above, the inventive samples provide excellent sensitivity, excellent printing durability, excellent stain elimination property, excellent dot reproduction, and excellent sludge restraining property.

Example 3

The light sensitive planographic printing plate precursor samples were prepared in the same manner as in Example 1, except that the sensitizing dyes used were changed to the sensitizing dyes as shown in Table 3 The resulting samples were processed in the same manner as in Example 1, except that the samples were imagewise exposed, employing an exposure apparatus COBALT-8 (produced by Escher-Grad Technologies Inc.) equipped with a violet laser (408 nm) light source instead of the exposure apparatus Tiger cat (produced by ECRM Co., Ltd.). Thus, a planographic printing plate samples were obtained. The resulting printing plate samples were evaluated in the same manner as in Example 1.

The results are shown in Table 3.

TABLE 3

| Compound of formula (1) or (2) | Compound of formula (3) or (4) | Sensitizing dye | Surfactant | Sensitivity ($\mu J/cm^2$) | Printing durability (number) | Stain elimination property (number) | *1 | Sludge (g) | Remarks |
|---|---|---|---|---|---|---|---|---|---|
| 1-1 | 37 | 5-1 | b | 170 | 55 | 18 | 94 | 0.5 | Inv. |
| 1-1 | 37 | 5-2 | b | 170 | 56 | 18 | 94 | 0.5 | Inv. |
| 2-1 | 37 | 5-1 | b | 180 | 57 | 20 | 94 | 0.5 | Inv. |
| 1-1 | 4-1 | 5-1 | b | 170 | 57 | 18 | 94 | 0.5 | Inv. |
| 1-1 | 4-1 | 5-2 | b | 160 | 58 | 18 | 94 | 0.5 | Inv. |
| 2-1 | 4-1 | 5-1 | b | 170 | 56 | 16 | 94 | 0.5 | Inv. |
| 1-1 | 37 | 5-1 | 1 | 150 | 59 | 18 | 94 | 0.2 | Inv. |
| 1-1 | 4-1 | 5-1 | 1 | 160 | 59 | 17 | 94 | 0.2 | Inv. |
| 10-2 | 4-1 | V-1 | 1 | 140 | 60 | 17 | 94 | 0.2 | Inv. |
| 10-3 | 4-1 | V-2 | 1 | 130 | 62 | 17 | 94 | 0.2 | Inv. |

*1: Reproduction of 90% dot (%), Inv: Inventive,
Sensitizing dye 5-1: λmax = 400 nm, Sensitizing dye 5-2: λmax = 410 nm, TABLE 3-continued

V-1

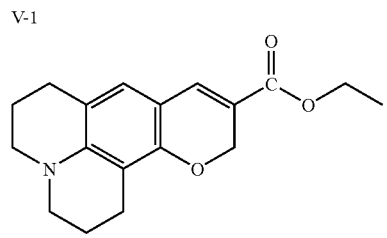

λmax: 430 nm

V-2

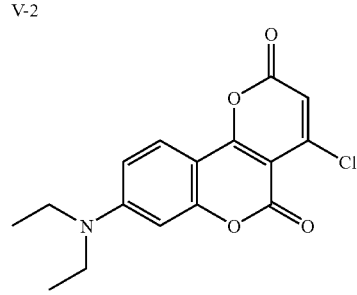

λmax: 425 nm

As is apparent from Table 3 above, the inventive samples provide excellent sensitivity, excellent printing durability, excellent stain elimination property, excellent dot reproduction, and excellent sludge restraining property.

Example 4

<<Preparation of Light Sensitive Planographic Printing Plate Precursor Samples 4-1 Through 4-18>>

A light sensitive planographic printing plate precursor was prepared in the same manner as in Example 1, except that following photopolymerizable light sensitive layer coating liquid was coated on the subbed support. Thus, light sensitive planographic printing plate precursor samples 4-1 through 4-18 as shown in Table 1 were prepared.

(Photopolymerizable Light Sensitive Layer Coating Liquid)

| | |
|---|---|
| Polymer binder (Acryl copolymer 1) | 35.0 parts |
| Sensitizing dye | 4.0 parts |
| (as shown in Table 4) | |
| IRGACURE 784 | 4.0 parts |
| (produced by Ciba Speciality Co., Ltd.) | |
| Compounds of formula (1) or | 50.0 parts |
| comparative compounds (as shown in Table 4) | |
| Phthalocyanine pigment | 4.5 parts |
| (MHI #454 produced by Mikuni Sikisosha) | |
| 2-t-Butyl-6-(3-t-butyl-2-hydroxy-5-methylbenzyl) | 0.5 parts |
| -4-methylphenyl acrylate | |
| (Sumirizer GS produced by Sumitomo 3M Co., Ltd.) | |
| Sanol LS-770 | 0.5 parts |
| (produced by Sankyo Co., Ltd.) | |
| Fluorine-contained surfactant | 0.5 parts |
| (Megafac F-178K produced by Sumitomo 3M Co., Ltd.) | |
| Triazine compound | 1.0 part |
| Methyl ethyl ketone | 80 parts |
| Cyclohexanone | 820 parts |

Comparative Compound 11: Polytetramethylene glycol diacrylate PTMGA-250 (produced by Kyoei Kagaku Co., Ltd.)

Sensitizing dye 12

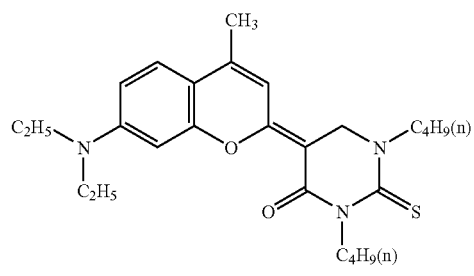

λmax: 540 nm

The resulting samples were processed in the same manner as in Example 1, except that the samples were imagewise exposed, employing an exposure apparatus COBALT-8 (produced by Escher-Grad Technologies Inc.) equipped with a violet laser (408 nm) light source instead of the exposure apparatus Tigercat (produced by ECRM Co., Ltd.), and developed with the following developer. Thus, planographic printing plate samples 4-1 through 4-18 were obtained.

Developer (Aqueous Solution Containing the Following Materials)

| | |
|---|---|
| Potassium silicate A (an aqueous potassium silicate solution containing 26.5% by weight of SiO$_2$ and 13.5% by weight of K$_2$O | 8.0% by weight |
| PELEX NBL produced by Kao Co., Ltd. | 3.0% by weight |
| Newcol B13 | 1.0% by weight |
| (produced by Nippon Nyukazai Co., Ltd.) | |
| Potassium hydroxide | Amount giving pH 12.3 |

The resulting printing plate samples 4-1 through 4-18 were evaluated according to the following methods.

<<Sensitivity>>

Sensitivity was represented in terms of minimum exposure amount through which a planographic printing plate was obtained in which an image of a 175 screen line number/inch with a dot area of 50% was reproduced. Herein, samples providing not more than 270 μJ/cm² of the minimum exposure amount can be practically used.

<<Printing Durability: Plate Cleaner Resistance>>

The light sensitive planographic printing plate precursor samples were exposed at an appropriate exposure amount and developed to obtain planographic printing plate samples. Herein, the appropriate exposure amount was two times the exposure amount whereby a planographic printing plate was obtained in which an image of a 175 screen line number/inch with a dot area of 50% was reproduced and no reduction of the layer thickness at image portions was observed. The resulting planographic printing plate samples were mounted on a printing press, DAIYA 1F-1 produced by Mitsubishi Jukogyo Co., Ltd., and printing was carried out employing a coated paper, printing ink (Toyo King Hyecho M Magenta, produced by Toyo Ink Manufacturing Co.), and dampening water SG-51 (concentration: 1.5%, produced by Tokyo Ink Co., Ltd.). Every time one thousand printed papers were obtained, the printing was suspended, and the planographic printing plate samples on the press were wiped with a plate cleaner. After that, the wiped samples were observed, and printing was finished when dot reduction at the highlight portions of the wiped samples were observed. The number of the wiping operation was used for a measure of printing durability. For example, printing durability 1 shows that printing was carried out up to one thousand copies. The greater number shows higher printing durability.

Herein, the printing plate is wiped with a plate cleaner in order to eliminate undesired inking on the printing plate, but the wiping reduces the layer strength at the image portions, resulting in lowering of printing durability. The above wiping procedure is often used for an accelerating procedure for determining printing durability. Printing durability was evaluated according to the following criteria.

A: Wiping operation number was not less than 35.
B: Wiping operation number was from 30 to less than 35.
C: Wiping operation number was from 25 to less than 30.
D: Wiping operation number was less than 25.

In the invention, samples providing evaluation A or B can be practically used.

<<Stain Elimination Property>>

Stain elimination property was evaluated in the same manner as in Example 1.

<<Reproduction of 90% dot>>

Reproduction of 90% dot was evaluated in the same manner as in Example 1. In the invention, samples providing a 90% dot reproduction of from 87 to 97% can be practically used.

The results are shown in Table 4.

TABLE 4

| Sample No. | Photo-polymerizable compound | Sensitizing dye | Sensitivity μJ/cm² | Printing durability | Stain elimination (number) | 90% Dot reproduction % | Remarks |
| --- | --- | --- | --- | --- | --- | --- | --- |
| 4-1 | Comparative compound 11 | Sensitizing dye 12 | 400 | D | 28 | 75 | Comp. |
| 4-2 | 1-1 | Sensitizing dye 12 | 370 | D | 28 | 77 | Comp. |
| 4-3 | Comparative compound 11 | 5-1 | 280 | D | 28 | 77 | Comp. |
| 4-4 | 1-1 | 5-1 | 160 | A | 22 | 96 | Inv. |
| 4-5 | 1-2 | 5-1 | 150 | A | 21 | 96 | Inv. |
| 4-6 | 1-3 | 5-1 | 170 | A | 23 | 96 | Inv. |
| 4-7 | 1-4 | 5-1 | 150 | A | 22 | 96 | Inv. |
| 4-8 | 1-5 | 5-1 | 160 | A | 22 | 96 | Inv. |
| 4-9 | 1-1 | 5-2 | 170 | A | 23 | 96 | Inv. |
| 4-10 | 1-1 | 5-3 | 150 | A | 20 | 96 | Inv. |
| 4-11 | 1-1 | 6-1 | 150 | A | 21 | 96 | Inv. |
| 4-12 | 1-1 | 6-2 | 160 | A | 22 | 96 | Inv. |
| 4-13 | 1-1 | 7-1 | 160 | A | 24 | 96 | Inv. |
| 4-14 | 1-1 | 7-2 | 170 | A | 24 | 96 | Inv. |
| 4-15 | 1-1 | 8-1 | 150 | A | 23 | 96 | Inv. |
| 4-16 | 1-1 | 8-2 | 160 | A | 22 | 96 | Inv. |
| 4-17 | 10-1 | 7-1 | 140 | A | 20 | 96 | Inv. |
| 4-18 | 10-8 | 7-1 | 140 | A | 20 | 96 | Inv. |

Inv.: Invention, Comp.: Comparative, 5-3: λmax = 420 nm, 6-1: λmax = 380 nm, 6-2: λmax = 390 nm, 7-1: λmax = 420 nm, 7-2: λmax = 420 nm, 8-1: λmax = 380 nm, 8-2: λmax = 390 nm As is apparent from Table 4 above, the inventive samples provide excellent sensitivity, excellent printing durability, excellent stain elimination property, and excellent 90% dot reproduction, as compared with comparative samples.

Example 5

<<Preparation of Light Sensitive Planographic Printing Plate Precursor Sample 5-1>>

A light sensitive planographic printing plate precursor sample 5-1 was prepared in the same manner as in light sensitive planographic printing plate precursor sample 4-1 of Example 4, except that a colorant as shown in Table 5 was further added to the overcoat coating layer to give an overcoat layer (which also functions as a color layer) with an optical density as shown in Table 5.

tion, the difference between the optical densities at λmax of the first and second samples is defined as the optical density of the colorant layer.

<<Preparation of Light Sensitive Planographic Printing Plate Precursor Samples 5-2 Through 5-12>>

Light sensitive planographic printing plate precursor samples 5-2 through 5-12 were prepared in the same manner as in sample 5-1, except that a photopolymerizable compound, a sensitizing dye, a colorant or optical density was changed to those as shown in Table 5.

The resulting samples were evaluated in the same manner as in Example 4. Further, a yellow lamp safety property was evaluated as follows.

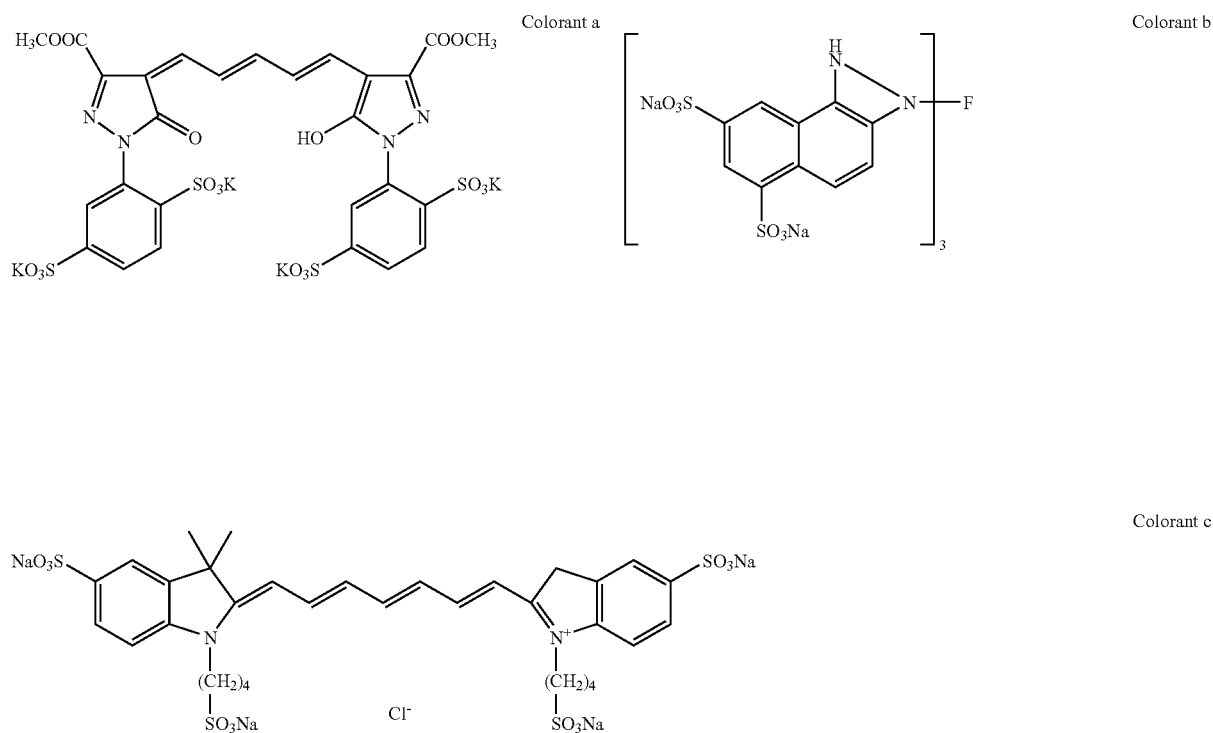

(Measurement of Optical Density of Color Layer)

A first sample is prepared by coating a color layer containing a colorant on a 100 μm thick transparent polyethylene terephthalate film. Similarly, a second sample is prepared by coating a layer containing no colorant on a 100 μm thick transparent polyethylene terephthalate film. The optical density of both samples was measured employing a spectrophotometer U-3300 (produced by Hitachi Co., Ltd.). In the inven- <<Measurement of Yellow Lamp Safety Time>>

The samples obtained above were exposed at an illuminance of 100 Lux to a yellow lamp Neolumi Super Yellow Rapid FLR40Y/M (produced by Mitsubishi Electric Co., Ltd.), and developed. The minimum exposure time which a residual layer was observed on the support after development was evaluated as yellow lamp safety time. The results are shown in Table 5.

TABLE 5

| Sample No. | Photo-polymerizable compound | Sensitizing dye | Colorant Kinds | Optical density | *Safety time (minutes) | Sensitivity μJ/cm² | *1 | *2 | *3 | Remarks |
|---|---|---|---|---|---|---|---|---|---|---|
| 5-1 | Comparative compound 11 | Sensitizing dye 12 | a | 0.5 | 1 | 400 | D | 30 | 74 | Comp. |
| 5-2 | 1-1 | Sensitizing dye 12 | a | 0.5 | 1 | 370 | D | 30 | 76 | Comp. |
| 5-3 | Comparative compound 11 | 5-4 | a | 0.5 | 12 | 330 | D | 30 | 76 | Comp. |
| 5-4 | 1-1 | 5-4 | a | 0.5 | 20 | 200 | A | 22 | 95 | Inv. |
| 5-5 | 1-1 | 5-4 | a | 0.1 | 12 | 180 | A | 23 | 96 | Inv. |
| 5-6 | 1-1 | 5-4 | a | 0.2 | 17 | 190 | A | 22 | 96 | Inv. |
| 5-7 | 1-1 | 5-4 | a | 3.0 | 22 | 230 | A | 23 | 96 | Inv. |
| 5-8 | 1-1 | 5-4 | a | 3.5 | 24 | 250 | A | 24 | 96 | Inv. |
| 5-9 | 1-1 | 5-4 | b | 0.5 | 20 | 210 | A | 22 | 95 | Inv. |
| 5-10 | 1-1 | 5-4 | c | 0.5 | 20 | 220 | A | 22 | 95 | Inv. |
| 5-11 | 10-9 | 5-4 | a | 0.5 | 23 | 170 | A | 20 | 95 | Inv. |
| 5-12 | 10-12 | 5-4 | a | 0.5 | 24 | 160 | A | 20 | 95 | Inv. |

Inv.: Invention, Comp.: Comparative, Sensitizing dye 5-4: λmax = 410 nm
*Safety time represents a yellow lamp safety time (minutes)
*1; Printing durability
*2; Stain elimination (number)
*3; 90% Dot reproduction %

As is apparent from Table 5 above, the inventive samples provide excellent sensitivity, excellent printing durability, excellent stain elimination property, and excellent 90% dot reproduction, as compared with comparative samples. Addition of colorant increases the yellow lamp safety time, and the increment of the time in the inventive samples is far greater than that in the comparative samples.

Example 6

<<Preparation of Light Sensitive Planographic Printing Plate Precursor Sample 6-1>>

A light sensitive planographic printing plate precursor sample 6-1 was prepared in the same manner as in light sensitive planographic printing plate precursor sample 4-1 of Example 4, except that the following intermediate coating solution A was coated on the photopolymerizable light sensitive layer to form an intermediate layer A, the overcoat coating solution layer was further added with a colorant as shown in Table 6 and coated on the resulting intermediate layer A to give a color layer B, and further the following protective layer coating solution C was coated on the color layer B to form a protective layer C.

(Intermediate Coating Solution A and Protective Layer Coating Solution C)

| | |
|---|---|
| Polyvinyl alcohol (GL-05, produced by Nippon Gosei Kagaku Co., Ltd.) | 89 parts |
| Water soluble polyamide (P-70, produced by Toray Co., Ltd.) | 10 parts |
| Surfactant (Surfinol 465, produced by Nisshin Kagaku Kogyo Co., Ltd.) | 1.0 parts |
| Water | 900 parts |
| (Color layer coating solution) | |
| Polyvinyl alcohol (GL-05, produced by Nippon Gosei Kagaku Co., Ltd.) | 89 parts |
| Water soluble polyamide (P-70, produced by Toray Co., Ltd.) | 10 parts |
| Surfactant (Surfinol 465, produced by Nisshin Kagaku Kogyo Co., Ltd.) | 1.0 parts |
| Colorant | As shown in Table 6 |
| Water | 900 parts |

<<Preparation of a Light Sensitive Planographic Printing Plate Precursor Sample 6-2>>

A light sensitive planographic printing plate precursor sample 6-2 was prepared in the same manner as in light sensitive planographic printing plate precursor sample 6-1, except that the overcoat coating solution layer of Example 4 was coated on the intermediate layer A to form an overcoat layer B, and the above colorant layer coating solution was coated on the overcoat layer B to form a colorant layer C.

<<Preparation of a Light Sensitive Planographic Printing Plate Precursor Sample 6-3>>

A light sensitive planographic printing plate precursor sample 6-3 was prepared in the same manner as in light sensitive planographic printing plate precursor sample 6-1, except that the colorant shown in Table 6 was further added with the intermediate coating solution A and coated on the photopolymerizable light sensitive layer to form a colorant layer A, and subsequently, the overcoat coating solution layer of Example 4 was coated on the resulting layer A to form an overcoat B, and further the above protective layer coating solution C was coated on the overcoat layer B to form a protective layer C.

Herein, the above colorants were added to give an optical density as shown in Table 6. The resulting light sensitive planographic printing plate precursor samples 6-1 through 6-3 were processed in the same manner as in Example 4 to obtain planographic printing plate samples 6-1 through 6-3, and evaluated in the same manner as in Example 4.

The results are shown in Table 6.

TABLE 6

| Sample No. | Photo-Polymerizable compound | Sensitizing dye | Colorant Kinds | Colorant Optical density | Layer added | *Saftey time (minutes) | Sensitivity μJ/cm² | Printing durability | Stain elimination (number) | 90% Dot reproduction % |
|---|---|---|---|---|---|---|---|---|---|---|
| 6-1 | 1-1 | 5-3 | a | 0.5 | B | 22 | 200 | A | 21 | 96 |
| 6-2 | 1-1 | 5-3 | a | 0.5 | C | 25 | 140 | A | 21 | 96 |
| 6-3 | 1-1 | 5-3 | a | 0.5 | A | 22 | 160 | A | 21 | 96 |

As is apparent from Table 6 above, the inventive samples 6-1, 6-2 and 6-3 provide excellent sensitivity, excellent printing durability, excellent stain elimination property, and excellent 90% dot reproduction. Particularly, sample (inventive) 6-2, in which the overcoat layer is provided on the photopolymerizable light sensitive layer and the colorant layer is provided on the over coat layer, provides higher sensitivity and longer safety time.

EFFECT OF THE INVENTION

The present invention provides a light sensitive planographic printing plate precursor, which is excellent in sensitivity, printing durability, a stain elimination property, dot reproduction, and a sludge restraining property.

What is claimed is:

1. A light sensitive planographic printing plate precursor comprising a hydrophilic support and provided thereon, a photopolymerizable light sensitive layer containing a first compound represented by the following formula (1) or (2) and a sensitizing dye having an absorption maximum in the wavelength regions of from 350 to 450 nm, formula (1)

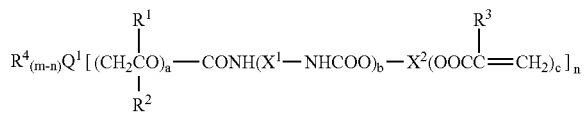

wherein $Q^1$ represents

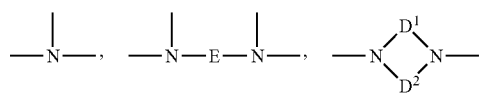

or —S—; $R^4$ represents an alkyl group, a hydroxy alkyl group, or an aryl group; $R^1$ and $R^2$ independently represent a hydrogen atom, an alkyl group, or an alkoxyalkyl group; $R^3$ represents a hydrogen atom, a methyl group, or an ethyl group; $x^1$ represents a divalent linkage group having a carbon atom number of from 2 to 12; $x^2$ represents a divalent linkage group, a trivalent linkage group, a tetravalent linkage group, or

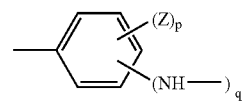

in which Z represents a hydrogen atom, an alkyl group, an alkenyl group, an aryl group, a halogen atom, an alkoxy group, or a heterocyclic group, p is an integer of from 1 to 4, and q is an integer of from 1 to 3; $D^1$ and $D^2$ independently represent a divalent linkage group having a carbon atom number of from 1 to 5; E represents an alkylene group having a carbon atom number of from 2 to 12 or an arylene group having a carbon atom number of from 6 to 12; a is an integer of from 1 to 4; b is 0 or 1; c is an integer of from 1 to 3; m is an integer of from 2 to 4; and n is an integer of from 1 to m, provided that plural groups having the same definition may be the same or different, formula (2)

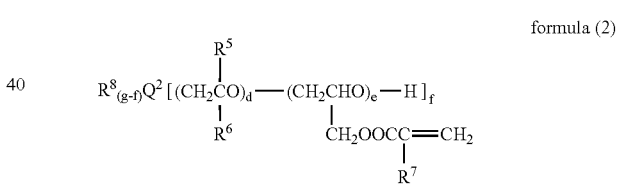

wherein $Q^2$ represents

—N—, —N—F—N—, —N⟨$D^3$/$D^4$⟩N—, $R^8$ represents an alkyl group, a hydroxy alkyl group, or an aryl group; $R^5$ and $R^6$ independently represent a hydrogen atom, an alkyl group, or an alkoxyalkyl group; and $R^7$ represents a hydrogen atom, a methyl group, or an ethyl group; $D^3$ and $D^4$ independently represent a divalent saturated hydrocarbon group having a carbon atom number of from 1 to 5; F represents an alkylene group having a carbon atom number of from 2 to 12 or an arylene group having a carbon atom number of from 6 to 12; d and e independently represent an integer of from 1 to 4; g is an integer of from 2 to 4; and f is an integer of from 1 to g, provided that plural groups having the same definition may be the same or different, and wherein the sensitizing dye is selected from the group consisting of compounds represented by the following formulae (5), and (8), formula (5)

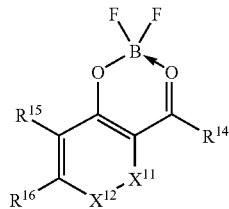

wherein $R^{14}$ represents a hydrogen atom, an alkyl group which may have a substituent, an alkenyl group which may have a substituent, an aryl group or a heterocyclic group; $R^{15}$ and $R^{16}$ represent a substituent capable of combining with each other to form a ring; and $X^{11}$ and $X^{12}$ independently represent $-CR^{17}R^{18}-$, $-O-$, $-S-$, or $-NR^{19}-$, in which $R^{17}$, $R^{18}$, and $R^{19}$ independently represent a hydrogen atom, an alkyl group, an alkenyl group, an aryl group or a heterocyclic group, formula (8)

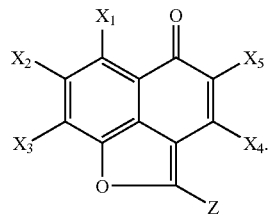

wherein $X_1$, $X_2$, $X_3$, $X_4$ and $X_5$ independently represent a substituent; and Z represents an aryl group or an aromatic heterocyclic group.

2. The light sensitive planographic printing plate precursor of claim 1, further comprising an overcoat layer containing polyvinyl alcohol provided on the photopolymerizable light sensitive layer.

3. A light sensitive planographic printing plate precursor comprising a hydrophilic support and provided thereon, a photopolymerizable light sensitive layer and a color layer in that order, the color layer having an optical density at wavelength regions of from 410 to 800 nm of from 0.2 to 3.0, and the photopolymerizable light sensitive layer containing a first compound represented by the following formula (1) or (2) and a sensitizing dye having an absorption maximum in the wavelength regions of from 350 to 450 nm, formula (1)

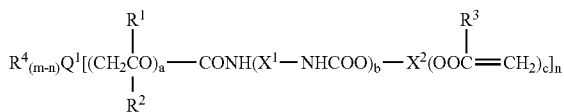

wherein $Q^1$ represents

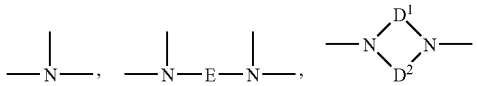

or $-S-$; $R^4$ represents an alkyl group, a hydroxy alkyl group, or an aryl group; $R^1$ and $R^2$ independently represent a hydrogen atom, an alkyl group, or an alkoxyalkyl group; $R^3$ represents a hydrogen atom, a methyl group, or an ethyl group; $X^1$ represents a divalent linkage group having a carbon atom number of from 2 to 12; $X^2$ represents a divalent linkage group, a trivalent linkage group, a tetravalent linkage group, or

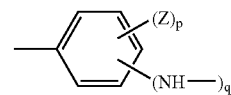

in which Z represents a hydrogen atom, an alkyl group, an alkenyl group, an aryl group, a halogen atom, an alkoxy group, or a heterocyclic group, p is an integer of from 1 to 4, and q is an integer of from 1 to 3; $D^1$ and $D^2$ independently represent a divalent linkage group having a carbon atom number of from 1 to 5; E represents an alkylene group having a carbon atom number of from 2 to 12 or an arylene group having a carbon atom number of from 6 to 12; a is an integer of from 1 to 4; b is 0 or 1; c is an integer of from 1 to 3; m is an integer of from 2 to 4; and n is an integer of from 1 to m, provided that plural groups having the same definition may be the same or different, formula (2)

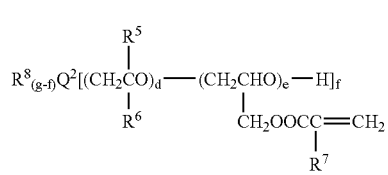

wherein $Q^2$ represents

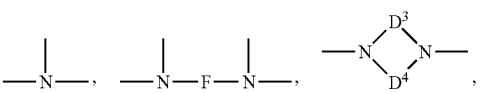

$R^2$ represents an alkyl group, a hydroxy alkyl group, or an aryl group; $R^5$ and $R^6$ independently represent a hydrogen atom, an alkyl group, or an alkoxyalkyl group; and $R^7$ represents a hydrogen atom, a methyl group, or an ethyl group; $D^3$ and $D^4$ independently represent a divalent saturated hydrocarbon group having a carbon atom number of from 1 to 5; F represents an alkylene group having a carbon atom number of from 2 to 12 or an arylene group having a carbon atom number of from 6 to 12; d and e independently represent an integer of from 1 to 4; g is an integer of from 2 to 4; and f is an integer of from 1 to g, provided that plural groups having the same definition may be the same or different, and wherein the sensitizing dye is selected from the group consisting of compounds represented by the following formulae (5), (6), (7), and (8),

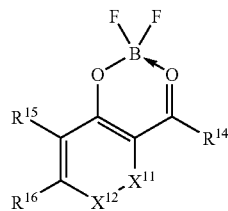

formula (5)

wherein $R^{14}$ represents a hydrogen atom, an alkyl group which may have a substituent, an alkenyl group which may have a substituent, an aryl group or a heterocyclic group; $R^{15}$ and $R^{16}$ represent a substituent capable of combining with each other to form a ring; and $X^{11}$ and $X^{12}$ independently represent $-CR^{17}R^{18}-$, $-O-$, $-S-$, or $-NR^{19}-$, in which $R^{17}$, $R^{18}$, and $R^{19}$ independently represent a hydrogen atom, an alkyl group, an alkenyl group, an aryl group or a heterocyclic group,

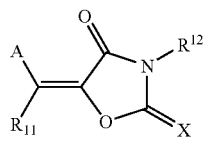

formula (6)

wherein A represents an aryl group or a heterocyclic group; X represents an oxygen atom, a sulfur atom or $-N(R_{13})-$; and $R_{11}$, $R_{12}$ and $R_{13}$ independently represent a hydrogen atom or a substituent, provided that A and $R_{11}$ may combine with each other to form a condensed ring or $R_{12}$ and $R_{13}$ may combine with each other to form a ring,

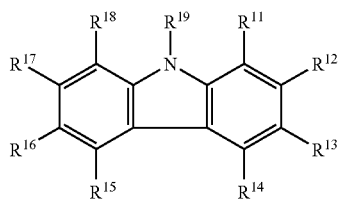

Formula (7)

wherein $R^{11}$, $R^{12}$, $R^{13}$, $R^{14}$, $R^{15}$, $R^{16}$, $R^{17}$, $R^{18}$ and $R^{19}$ independently represent a hydrogen atom or a substituent, provided that two adjacent groups of $R^{11}$, $R^{12}$, $R^{13}$, $R^{14}$, $R^{15}$, $R^{16}$, $R^{17}$, $R^{18}$ and $R^{19}$ may combine with each other to form a ring, and at least one of $R^{11}$ and $R^{13}$ represents an organic residue represented by the following formula P,

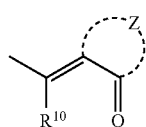

formula P in which $R^{10}$ represents a hydrogen atom or a substituent and Z represents a non-metallic atomic group necessary to form a 5-member acidic nucleus, and wherein when $R^{11}$ is represented by formula P, $R^{10}$ may combine with $R^{12}$ or $R^{19}$ to form a ring, when $R^{13}$ is represented by formula P, $R^{10}$ may combine with $R^{12}$ or $R^{14}$ to form a ring, and when $R^{11}$ and $R^{13}$ both are represented by formula P, $R^{10}$ may combine with $R^{14}$ or $R^{19}$ to form a ring,

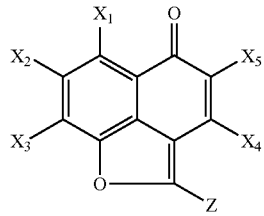

formula (8)

wherein $X_1$, $X_2$, $X_3$, $X_4$ and $X_5$ independently represent a substituent and Z represents an aryl group or an aromatic heterocyclic group.

4. The light sensitive planographic printing plate precursor of claim 3, further comprising an overcoat layer containing polyvinyl alcohol, wherein the overcoat layer is provided between the photopolymerizable light sensitive layer and the color layer.

* * * * *